(12) United States Patent
Masuoka et al.

(10) Patent No.: US 10,312,110 B2
(45) Date of Patent: Jun. 4, 2019

(54) METHOD FOR MANUFACTURING AN SGT-INCLUDING SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 4 days.

(21) Appl. No.: 15/360,488

(22) Filed: Nov. 23, 2016

(65) Prior Publication Data
US 2017/0076996 A1    Mar. 16, 2017

Related U.S. Application Data

(60) Division of application No. 14/511,215, filed on Oct. 10, 2014, now Pat. No. 9,613,827, which is a
(Continued)

(51) Int. Cl.
*H01L 27/06* (2006.01)
*H01L 29/08* (2006.01)
(Continued)

(52) U.S. Cl.
CPC ........ *H01L 21/324* (2013.01); *H01L 21/2251* (2013.01); *H01L 21/2257* (2013.01);
(Continued)

(58) Field of Classification Search
CPC ....... H01L 21/823885; H01L 29/66666; H01L 21/324; H01L 21/2251; H01L 21/2257;
(Continued)

(56) References Cited

U.S. PATENT DOCUMENTS

| 5,258,635 A | 11/1993 | Nitayama et al. |
| 8,486,785 B2 * | 7/2013 | Masuoka ............... H01L 21/84 |
| | | 257/288 |

(Continued)

FOREIGN PATENT DOCUMENTS

| JP | H02188966 A | 7/1990 |
| WO | 2009095997 A1 | 8/2009 |
| WO | 2013088520 A1 | 6/2013 |

OTHER PUBLICATIONS

Hiroshi Takato et al., "Impact of Surrounding Gate Transistor (SGT) for Ultra-High Density LSI's ", IEEE Transactions on Electron Devices, vol. 38, No. 3, Mar. 1991, pp. 573-578.
(Continued)

*Primary Examiner* — Jarrett J Stark
*Assistant Examiner* — Charles N Ausar-El
(74) *Attorney, Agent, or Firm* — Laurence Greenberg; Werner Stemer; Ralph Locher

(57) ABSTRACT

A method for manufacturing a semiconductor device includes forming an SGT in a semiconductor pillar on a semiconductor substrate and forming a wiring semiconductor layer so as to contact a side surface of an impurity region present in a center portion of the semiconductor pillar or a side surface of a gate conductor layer. A first alloy layer formed in a side surface of the wiring semiconductor layer is directly connected to the impurity region and the gate conductor layer and is connected to an output wiring metal layer through a contact hole formed on an upper surface of a second alloy layer formed in an upper surface and the side surface of the wiring semiconductor layer.

8 Claims, 27 Drawing Sheets

Related U.S. Application Data continuation of application No. PCT/JP2013/080009, filed on Nov. 6, 2013.

(51) Int. Cl.

| | |
|---|---|
| *H01L 29/66* | (2006.01) |
| *H01L 21/225* | (2006.01) |
| *H01L 21/285* | (2006.01) |
| *H01L 21/311* | (2006.01) |
| *H01L 21/324* | (2006.01) |
| *H01L 21/822* | (2006.01) |
| *H01L 23/522* | (2006.01) |
| *H01L 23/532* | (2006.01) |
| *H01L 27/092* | (2006.01) |
| *H01L 29/417* | (2006.01) |
| *H01L 29/423* | (2006.01) |
| *H01L 29/786* | (2006.01) |
| *H01L 29/788* | (2006.01) |
| *H01L 29/792* | (2006.01) |
| *H01L 21/8238* | (2006.01) |
| *H01L 27/11582* | (2017.01) |

(52) U.S. Cl.
CPC .. *H01L 21/28531* (2013.01); *H01L 21/31111* (2013.01); *H01L 21/31144* (2013.01); *H01L 21/823807* (2013.01); *H01L 21/823814* (2013.01); *H01L 21/823828* (2013.01); *H01L 21/823871* (2013.01); *H01L 21/823885* (2013.01); *H01L 23/5226* (2013.01); *H01L 23/53271* (2013.01); *H01L 27/092* (2013.01); *H01L 29/0847* (2013.01); *H01L 29/41741* (2013.01); *H01L 29/42392* (2013.01); *H01L 29/66666* (2013.01); *H01L 29/78618* (2013.01); *H01L 29/78642* (2013.01); *H01L 29/78696* (2013.01); *H01L 21/8221* (2013.01); *H01L 27/0688* (2013.01); *H01L 27/11582* (2013.01); *H01L 29/788* (2013.01); *H01L 29/792* (2013.01)

(58) Field of Classification Search
CPC ......... H01L 21/28531; H01L 21/31111; H01L 21/31144; H01L 21/823807; H01L 21/823814; H01L 21/823828; H01L 21/823871; H01L 23/5226; H01L 23/53271; H01L 27/092; H01L 29/0847; H01L 29/41741; H01L 29/42392; H01L 29/78618; H01L 29/78642; H01L 29/78696

See application file for complete search history.

(56) References Cited

U.S. PATENT DOCUMENTS

| | | | |
|---|---|---|---|
| 8,497,548 B2 | 7/2013 | Masuoka et al. | |
| 8,647,947 B2 | 2/2014 | Masuoka et al. | |
| 9,111,794 B2* | 8/2015 | Masuoka | H01L 27/092 |
| 9,153,697 B2* | 10/2015 | Masuoka | H01L 21/26586 |
| 9,536,977 B2* | 1/2017 | Chuang | H01L 21/26513 |
| 2010/0207201 A1* | 8/2010 | Masuoka | H01L 27/0207 257/329 |
| 2010/0210079 A1* | 8/2010 | Masuoka | H01L 29/42392 438/156 |
| 2010/0213539 A1 | 8/2010 | Masuoka et al. | |
| 2011/0303985 A1 | 12/2011 | Masuoka et al. | |
| 2012/0228677 A1* | 9/2012 | Masuoka | H01L 21/823487 257/262 |
| 2013/0153989 A1* | 6/2013 | Masuoka | H01L 29/66666 257/329 |
| 2013/0252413 A1 | 9/2013 | Masuoka et al. | |
| 2014/0239247 A1 | 8/2014 | Park | |
| 2015/0206588 A1 | 7/2015 | Masuoka et al. | |
| 2015/0236105 A1 | 8/2015 | Masuoka et al. | |
| 2015/0236152 A1 | 8/2015 | Masuoka et al. | |
| 2015/0255598 A1 | 9/2015 | Masuoka et al. | |
| 2015/0287821 A1 | 10/2015 | Masuoka et al. | |
| 2015/0287822 A1 | 10/2015 | Masuoka et al. | |
| 2015/0311255 A1 | 10/2015 | Park | |
| 2016/0056173 A1* | 2/2016 | Masuoka | H01L 29/66666 257/203 |

OTHER PUBLICATIONS

Hyoungjun Na et al., "A New Compact SRAM Cell by Vertical MOSFET for Low-power and Stable Operation", Memory Workshop, 3rd IEEE International Digest, 2011, pp. 1-4.

Tadashi Shibata et al., "A New Field Isolation Technology for High-Density MOS LSI", Japanese Journal of Applied Physics, vol. 18, (1979), Supplement 18-1, pp. 263-267.

* cited by examiner

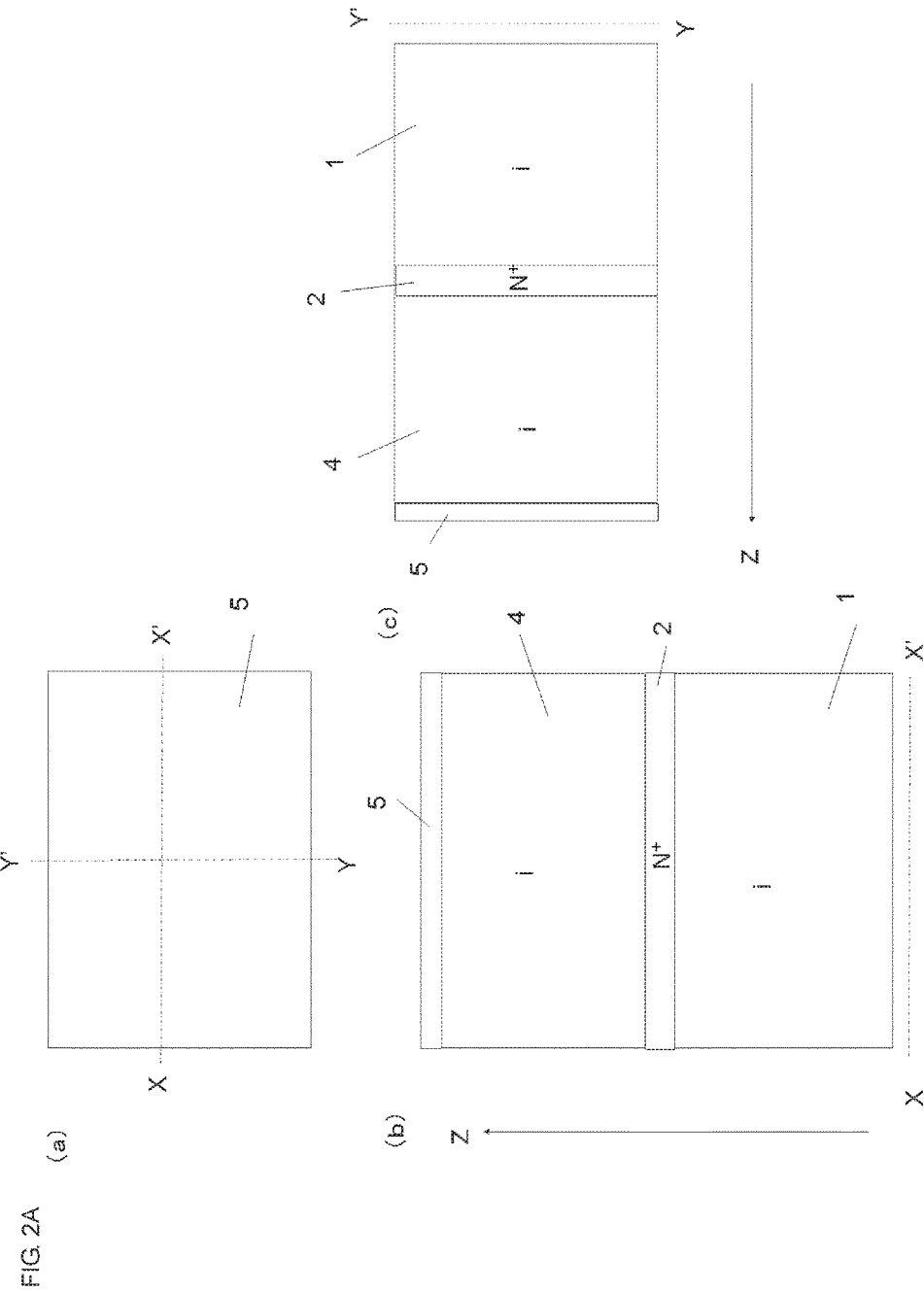

METHOD FOR MANUFACTURING AN SGT-INCLUDING SEMICONDUCTOR DEVICE

CROSS-REFERENCE TO RELATED APPLICATIONS

This application is a divisional of copending application Ser. No. 14/511,215, filed Oct. 10, 2014, which is a continuation, under 35 U.S.C. § 120, of international application No. PCT/JP2013/080009, filed Nov. 6, 2013, the contents of the prior applications are incorporated herein by reference in their entirety.

BACKGROUND OF THE INVENTION

Field of the Invention

The present invention relates to a semiconductor device that includes a surrounding gate MOS transistor (SGT) and a method for manufacturing the semiconductor device.

In recent years, SGTs have gathered much attention as semiconductor elements that can be used to form highly integrated semiconductor devices. A further increase in the degree of integration of SGT-including semiconductor devices is highly anticipated.

A typical planar MOS transistor has a channel extending in a horizontal direction along a surface of a semiconductor substrate. In contrast, the channel of an SGT extends in a direction perpendicular to the surface of the semiconductor substrate (for example, refer to Patent Literature 1 and Non Patent Literature 1). Thus, compared to planar MOS transistors, SGTs help increase the density of semiconductor devices.

FIG. 8 is a schematic diagram of an N-channel SGT. An $N^+$ region 101a and an $N^+$ region 101b (hereinafter a semiconductor region having a high donor impurity concentration is referred to as an "$N^+$ region") are respectively formed in an upper portion and a lower portion of a Si pillar 100 having a P-type or i(intrinsic)-type conductivity (hereinafter a silicon semiconductor pillar is referred to as "Si pillar"). When the $N^+$ region 101a serves as a source, the $N^+$ region 101b serves as a drain and when the $N^+$ region 101a serves as a drain, the $N^+$ region 101b serves as a source. The Si pillar 100 that lies between the $N^+$ region 101a and $N^+$ region 101b serving as a source and a drain is a channel region 102. A gate insulating layer 103 is formed so as to surround the channel region 102 and a gate conductor layer 104 is formed so as to surround the gate insulating layer 103. In the SGT, the $N^+$ regions 101a and 101b serving as a source and a drain, the channel region 102, the gate insulating layer 103, and the gate conductor layer 104 are formed within a single Si pillar 100. Accordingly, the area of the SGT in plan view corresponds to the area of a single source or drain $N^+$ region of a planar MOS transistor. Thus, a circuit chip that includes SGTs is smaller than a circuit chip that includes planar MOS transistors.

Attempts are now being made to further decrease the size of SGT-including circuit chips. For example, it has been anticipated that the circuit area can be reduced by forming two SGTs 116a and 116b in the upper portion and the lower portion of one Si pillar 115 as illustrated in a schematic diagram of FIG. 9 (for example, refer to Non Patent Literature 2).

FIG. 9 is a schematic diagram of a CMOS inverter circuit in which an N channel SGT 116a is formed in a lower portion of the Si pillar 115 and a P channel SGT 116b is formed above the N channel SGT 116a. The Si pillar 115 is formed on a P layer substrate 117 (hereinafter, a semiconductor layer containing an acceptor impurity is referred to as a "P layer"). A $SiO_2$ layer 118 is formed at the outer periphery of the Si pillar 115 and on the P layer substrate 117. A gate insulating layer 119a of the N channel SGT 116a and a gate insulating layer 119b of the P channel SGT 116b are formed so as to surround the Si pillar 115. A gate conductor layer 120a of the N channel SGT 116a and a gate conductor layer 120b of the P channel SGT 116b are formed at the outer periphery of the Si pillar 115 so as to surround the gate insulating layers 119a and 119b. An $N^+$ region 121a is formed in a surface layer portion of the P layer substrate 117 connected to the bottom portion of the Si pillar 115, an $N^+$ region 121b is formed at the center of the Si pillar 115, a $P^+$ region 122a (hereinafter a semiconductor region having a high acceptor impurity concentration is referred to as a "$P^+$ region") is formed within the Si pillar 115 connected to the $N^+$ region 121b, and a $P^+$ region 122b is formed in a top portion of the Si pillar 115. The $N^+$ region 121a is a source of the N channel SGT 116a and the $N^+$ region 121b is a drain of the N channel SGT 116a. The Si pillar 115 that lies between the $N^+$ regions 121a and 121b is a channel region 123a of the N channel SGT 116a. The $P^+$ region 122b is a source of the P channel SGT 116b and the $P^+$ region 122a is a drain of the P channel SGT 116b. The Si pillar 115 that lies between the $P^+$ regions 122a and 122b is a channel region 123b of the P channel SGT 116b. A nickel silicide layer (NiSi layer) 125a is formed in the surface layer portion of the $N^+$ region 121a connected to the bottom portion of the Si pillar 115, a NiSi layer 125b is formed at the outer peripheries of the $N^+$ region 121b and the $P^+$ region 122a located in the center portion of the Si pillar 115, and a NiSi layer 125c is formed in an upper surface layer of the $P^+$ region 122b in the top portion of the Si pillar 115. A ground wiring metal layer 126a is formed so as to connect to the NiSi layer 125a in the $N^+$ region 121a. The ground wiring metal layer 126a is connected to a ground terminal VSS. Similarly, an output wiring metal layer 126b is formed so as to connect to the NiSi layer 125b. The output wiring metal layer 126b is connected to an output terminal Vo. Similarly, a power supply wiring metal layer 126c is formed so as to connect to the NiSi layer 125c. The power supply wiring metal layer 126c is connected to a power supply terminal VDD. Input wiring metal layers 127a and 127b are formed so as to connect to the gate conductor layers 120a and 120b. The input wiring metal layers 127a and 127b are each connected to an input terminal Vi.

In the schematic diagram of FIG. 9, the NiSi layer 125b connected to the $N^+$ region 121b and the $P^+$ region 122a located at the center portion of the Si pillar 115 is formed by coating outer peripheral surfaces of the $N^+$ region 121b and the $P^+$ region 122a with a nickel (Ni) film, performing a heat treatment at about 450° C., and removing the Ni film remaining on the surfaces. As a result, the NiSi layer 125b is formed so as to extend from the outer peripheries of the $N^+$ region 121b and the $P^+$ region 122a toward the interior. For example, when the Si pillar 115 has a diameter of 20 nm, the NiSi layer 125b is preferably formed to have a thickness of about 5 nm to 10 nm. When the NiSi layer 125b has a thickness of 10 nm, the NiSi layer 125b occupies the entire cross section of the Si pillar 115. The linear thermal expansion coefficient of NiSi is $12 \times 10^{-6}$/K, which is five times the linear thermal expansion coefficient of Si which is $2.4 \times 10^{-6}$/K. Thus, large stress-induced strain is generated inside the Si pillar 115 due to the NiSi layer 125b. As a result, failures such as bending or collapsing of the Si pillar 115 may readily occur. More failures would occur when the diameter of the Si pillar is decreased in order to increase the degree of circuit integration.

The following citations are referenced in this application. They are herewith incorporated by reference:

PATENT LITERATURE

PTL 1: Japanese Unexamined Patent Application Publication No. 2-188966

NON PATENT LITERATURE

NPL 1: Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
NPL 2: Hyoungjun Na and Tetsuo Endoh: "A New Compact SRAM cell by Vertical MOSFET for Low-power and Stable Operation", Memory Workshop, 201 $3^{rd}$ IEEE International Digest, pp. 1 to 4 (2011)
NPL 3: Tadashi Shibata, Susumu Kohyama and Hisakazu Iizuka: "A New Field Isolation Technology for High Density MOS LSI", Japanese Journal of Applied Physics, Vol. 18, pp. 263-267 (1979)

According to an SGT-including semiconductor device illustrated in FIG. 9, during formation of the NiSi layer 125b connected to the $N^+$ region 121b and the $P^+$ region 122a located at the center portion of the single Si pillar 115, the difference in linear thermal expansion coefficient between Si and NiSi causes stress-induced strain in the Si pillar 115, leading to bending or collapsing of the Si pillar 115. Due to these failures, it becomes difficult to obtain a circuit that includes an SGT and operates normally. There is also a problem in which decreasing the diameter of the Si pillar 115 to increase the degree of circuit integration increases the likelihood of bending and collapsing of the Si pillar 115. To address this, formation of a NiSi layer 125b that connects to the $N^+$ region 121b and the $P^+$ region 122a without causing bending or collapsing of the Si pillar 115 is desired.

SUMMARY OF THE INVENTION

A first aspect of the present invention provides a surrounding gate MOS transistor (SGT)-including semiconductor device that includes:

a first semiconductor pillar formed on a semiconductor substrate;

a first impurity region containing a donor impurity or an acceptor impurity and being formed in a lower portion of the first semiconductor pillar;

a second impurity region formed in the first semiconductor pillar at a position above and remote from the first impurity region, the second impurity region having the same conductivity type as the first impurity region;

a first gate insulating layer formed to surround an outer periphery of the first semiconductor pillar that lies between the first impurity region and the second impurity region;

a first gate conductor layer formed to surround an outer periphery of the first gate insulating layer;

a wiring semiconductor layer in contact with an outer peripheral side surface of the first impurity region, the second impurity region, or the first gate conductor layer;

a first alloy layer formed in a side surface of the wiring semiconductor layer;

a second alloy layer formed in an upper surface and the side surface of the wiring semiconductor layer and connected to the first alloy layer;

a contact hole formed on an upper surface of the second alloy layer; and a wiring metal layer electrically connected to the first impurity region, the second impurity region, or the first gate conductor layer through the contact hole, wherein the semiconductor device includes a first SGT in which when one of the first impurity region and the second impurity region serves as a source, the other serves as a drain, the first semiconductor pillar that lies between the first impurity region and the second impurity region serves as a channel, and the first gate conductor layer surrounding the outer periphery of the first gate insulating layer serves as a gate.

Preferably, the SGT-including semiconductor device includes:

a third impurity region located above the second impurity region and formed in an upper portion of the first semiconductor pillar;

a fourth impurity region formed in the first semiconductor pillar at a position above and remote from the third impurity region, the fourth impurity region having the same conductivity type as the third impurity region;

a second gate insulating layer formed to surround an outer periphery of the first semiconductor pillar that lies between the third impurity region and the fourth impurity region;

a second gate conductor layer formed to surround an outer periphery of the second gate insulating layer;

the wiring semiconductor layer that is in contact with the second impurity region and the third impurity region and that is formed to connect the second impurity region to the third impurity region;

a fifth impurity region that is formed in the wiring semiconductor layer, is connected to the second impurity region, contains a donor or acceptor impurity contained in the second impurity region so as to have the same conductivity type as the second impurity region, and is in contact with the first alloy layer;

a sixth impurity region that is formed in the wiring semiconductor layer, is connected to the third impurity region, contains a donor or acceptor impurity contained in the third impurity region so as to have the same conductivity type as the third impurity region, and is in contact with the first alloy layer;

the second alloy layer formed in the upper surface and the side surface of the wiring semiconductor layer and connected to the first alloy layer; and the wiring metal layer electrically connected to the second impurity region and the third impurity region through the contact hole formed on the upper surface of the second alloy layer, wherein the semiconductor device includes a second SGT in which one of the third impurity region in contact with the second impurity region of the first SGT and the fourth impurity region serves as a source and the other serves as a drain, the first semiconductor pillar that lies between the third impurity region and the fourth impurity region serves as a channel, and the second gate conductor layer surrounding the outer periphery of the second gate insulating layer serves as a gate.

Preferably, the wiring semiconductor layer contains a donor or acceptor impurity contained in the impurity region having the lower concentration out of the second impurity region and the third impurity region, and the impurity region having the lower impurity concentration is formed by thermal diffusion of the donor or acceptor impurity contained in the wiring semiconductor layer.

Preferably, the contact hole is formed on the upper surface of the second alloy layer and formed so as to contain the second alloy layer in a portion connected to the side surface of the wiring semiconductor layer.

Preferably, the first wiring semiconductor layer has a thickness larger than a half of a length of one side of the contact hole in plan view.

Preferably, the SGT-including semiconductor device includes:

a second semiconductor pillar formed near the first semiconductor pillar;

a third SGT formed in the second semiconductor pillar;

a third gate conductor layer formed to surround an outer periphery of the second semiconductor pillar;

the wiring semiconductor layer in contact with the first gate conductor layer and the third gate conductor layer and formed so as to connect the first gate conductor layer to the third gate conductor layer;

the first alloy layer positioned at a side surface of the wiring semiconductor layer surrounding the outer periphery of the first semiconductor pillar and in contact with the first gate conductor layer;

a third alloy layer positioned at the side surface of the wiring semiconductor layer surrounding an outer periphery of the second semiconductor pillar and in contact with the third gate conductor layer;

a second alloy layer positioned in an upper surface portion of the wiring semiconductor layer and the side surface of the wiring semiconductor layer surrounding the outer peripheries of the first semiconductor pillar and the second semiconductor pillar; and the wiring metal layer electrically connected to the first gate conductor layer and the third gate conductor layer through the contact hole, the first alloy layer, the second alloy layer, and the third alloy layer.

Preferably, the second alloy layer is in contact with the fifth impurity region and the sixth impurity region.

Preferably, the wiring semiconductor layer contains a donor or acceptor impurity;

the donor or acceptor impurity of the wiring semiconductor layer thermally diffuses into the first semiconductor pillar by performing a heat treatment so as to form a seventh impurity region in the first semiconductor pillar; and SGTs of the same conductivity type are respectively formed above and below the seventh impurity region.

A second aspect of the present invention provides a method for manufacturing an SGT-including semiconductor device, the method including:

a first semiconductor pillar forming step of forming a first semiconductor pillar on a semiconductor substrate;

a first impurity region forming step of forming a first impurity region in a lower portion of the first semiconductor pillar, the first impurity region containing a donor or acceptor impurity;

a second impurity region forming step of forming a second impurity region in the first semiconductor pillar at a position above and remote from the first impurity region, the second impurity region having the same conductivity type as the first impurity region;

a first gate insulating layer forming step of forming a first gate insulating layer so as to surround an outer periphery of the first semiconductor pillar that lies between the first impurity region and the second impurity region;

a first gate conductor layer forming step of forming a first gate conductor layer so as to surround an outer periphery of the first gate insulating layer;

a wiring semiconductor layer forming step of forming a wiring semiconductor layer in contact with an outer peripheral side surface of the first impurity region, the second impurity region, or the first gate conductor layer;

a first and second alloy layers forming step of forming a first alloy layer in a side surface of the wiring semiconductor layer and forming a second alloy layer in an upper surface and the side surface of the wiring semiconductor layer so that the second alloy layer is connected to the first alloy layer;

a contact hole forming step of forming a contact hole on an upper surface of the second alloy layer; and a wiring metal layer forming step of forming a wiring metal layer electrically connected to the first impurity region, the second impurity region, or the first gate conductor layer through the contact hole, wherein a first SGT is formed in which when one of the first impurity region and the second impurity region serves as a source, the other serves as a drain, the first semiconductor pillar that lies between the first impurity region and the second impurity region serves as a channel, and the first gate conductor layer surrounding the outer periphery of the first gate insulating layer serves as a gate.

Preferably, the method includes:

a third impurity region forming step of forming a third impurity region in an upper portion of the first semiconductor pillar, the third impurity region being located above the second impurity region;

a fourth impurity region forming step of forming a fourth impurity region in the first semiconductor pillar at a position above and remote from the third impurity region, the fourth impurity region having the same conductivity type as the third impurity region;

a second gate insulating layer forming step of forming a second gate insulating layer so as to surround an outer periphery of the first semiconductor pillar that lies between the third impurity region and the fourth impurity region;

a second gate conductor layer forming step of forming a second gate conductor layer so as to surround an outer periphery of the second gate insulating layer;

the wiring semiconductor layer forming step of forming the wiring semiconductor layer in contact with the second impurity region and the third impurity region so that the wiring semiconductor layer connects the second impurity region to the third impurity region;

a fifth impurity region forming step of forming a fifth impurity region in the wiring semiconductor layer, the fifth impurity region being connected to the second impurity region, containing a donor or acceptor impurity contained in the second impurity region so as to have the same conductivity type as the second impurity region, and being in contact with the first alloy layer;

a sixth impurity region forming step of forming a sixth impurity region in the wiring semiconductor layer, the sixth impurity region being connected to the third impurity region, containing a donor or acceptor impurity contained in the third impurity region so as to have the same conductivity type as the third impurity region, and being in contact with the first alloy layer;

the second alloy layer forming step of forming the second alloy layer in the upper surface and the side surface of the wiring semiconductor layer, the second alloy layer being connected to the first alloy layer;

the contact hole forming step of forming the contact hole on the upper surface of the second alloy layer; and the wiring metal layer forming step of forming the wiring metal layer electrically connected to the second impurity region and the third impurity region through the contact hole, wherein a second SGT is formed in which when one of the third impurity region in contact with the second impurity region of the first SGT and the fourth impurity region serves as a source, the other serves as a drain, the first semiconductor pillar that lies between the third impurity region and the fourth impurity region serves as a channel, and the second gate conductor layer surrounding the outer periphery of the second gate insulating layer serves as a gate.

Preferably, the wiring semiconductor layer is caused to contain a donor or acceptor impurity contained in the impurity region having the lower impurity concentration out of the second impurity region and the third impurity region;

the donor or acceptor impurity contained in the wiring semiconductor layer is thermally diffused into the first semiconductor pillar from the first wiring semiconductor layer; and the second impurity region and the third impurity region are formed in the first semiconductor pillar.

Preferably, the contact hole is formed on the upper surface of the second alloy layer so as to contain the upper surface and the side surface of the second alloy layer in a portion of the first contact hole.

Preferably, the wiring semiconductor layer is formed to have a thickness larger than a half of a length of one side of the contact hole in plan view.

Preferably, the method includes:

a second semiconductor pillar forming step of forming a second semiconductor pillar near the first semiconductor pillar;

a third SGT forming step of forming a third SGT in the second semiconductor pillar;

a third gate conductor layer forming step of forming a third gate conductor layer so as to surround an outer periphery of the second semiconductor pillar;

the wiring semiconductor layer forming step of forming the wiring semiconductor layer in contact with the first gate conductor layer and the third gate conductor layer and connecting the first gate conductor layer to the third gate conductor layer;

the first alloy layer forming step of forming the first alloy layer so as to be positioned in a side surface of the wiring semiconductor layer surrounding the outer periphery of the first semiconductor pillar and in contact with the first gate conductor layer;

a third alloy layer forming step of forming a third alloy layer that is positioned in a side surface of the wiring semiconductor layer surrounding the outer periphery of the second semiconductor pillar and in contact with the third gate conductor layer;

the second alloy layer forming step of forming the second alloy layer that is positioned in an upper surface layer portion of the wiring semiconductor layer and the side surface of the wiring semiconductor surrounding the outer peripheries of the first semiconductor pillar and the second semiconductor pillar and that connects the first alloy layer to the third alloy layer;

the contact hole forming step of forming the contact hole on an upper surface of the second alloy layer; and the wiring metal layer forming step of forming the wiring metal layer so as to be electrically connected to the first gate conductor layer and the third gate conductor layer through the contact hole, the first alloy layer, the second alloy layer, and the third alloy layer.

Preferably, the second alloy layer is formed so as to contact the fifth impurity region and the sixth impurity region.

Preferably, the method includes:

causing the wiring semiconductor layer to contain a donor or acceptor impurity;

forming a seventh impurity region in the first semiconductor pillar by thermally diffusing the donor or acceptor impurity of the wiring semiconductor layer into the first semiconductor pillar through a heat treatment; and forming SGTs of the same conductivity type above and below the seventh impurity region.

Advantageous Effects of Invention

According to the present invention, in an SGT-including semiconductor device, bending or collapsing of a semiconductor pillar that would occur when an alloy layer is formed in a metal wiring layer electrically connected to a semiconductor region or gate conductor region in the center portion of the semiconductor pillar is suppressed. Thus, the connection between semiconductor region or gate conductor region and a wiring metal layer connected to the alloy layer can be reliably established.

Other features which are considered as characteristic for the invention are set forth in the appended claims.

Although the invention is illustrated and described herein as embodied in sgt-including semiconductor device and method for manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWINGS

FIG. 2A includes a plan view (a) and cross-sectional views (b) and (c) of a CMOS inverter circuit illustrating a method for manufacturing an SGT-including semiconductor device according to a second embodiment of the present invention.

DETAILED DESCRIPTION OF THE INVENTION

An SGT-including semiconductor device and a manufacturing method therefor according to embodiments of the present invention will now be described with reference to the drawings.

First Embodiment

A method for manufacturing a CMOS inverter circuit, which is an SGT-including semiconductor device, according to a first embodiment of the present invention will now be described with reference to FIGS. 1A to 1M.

Figure 1A:
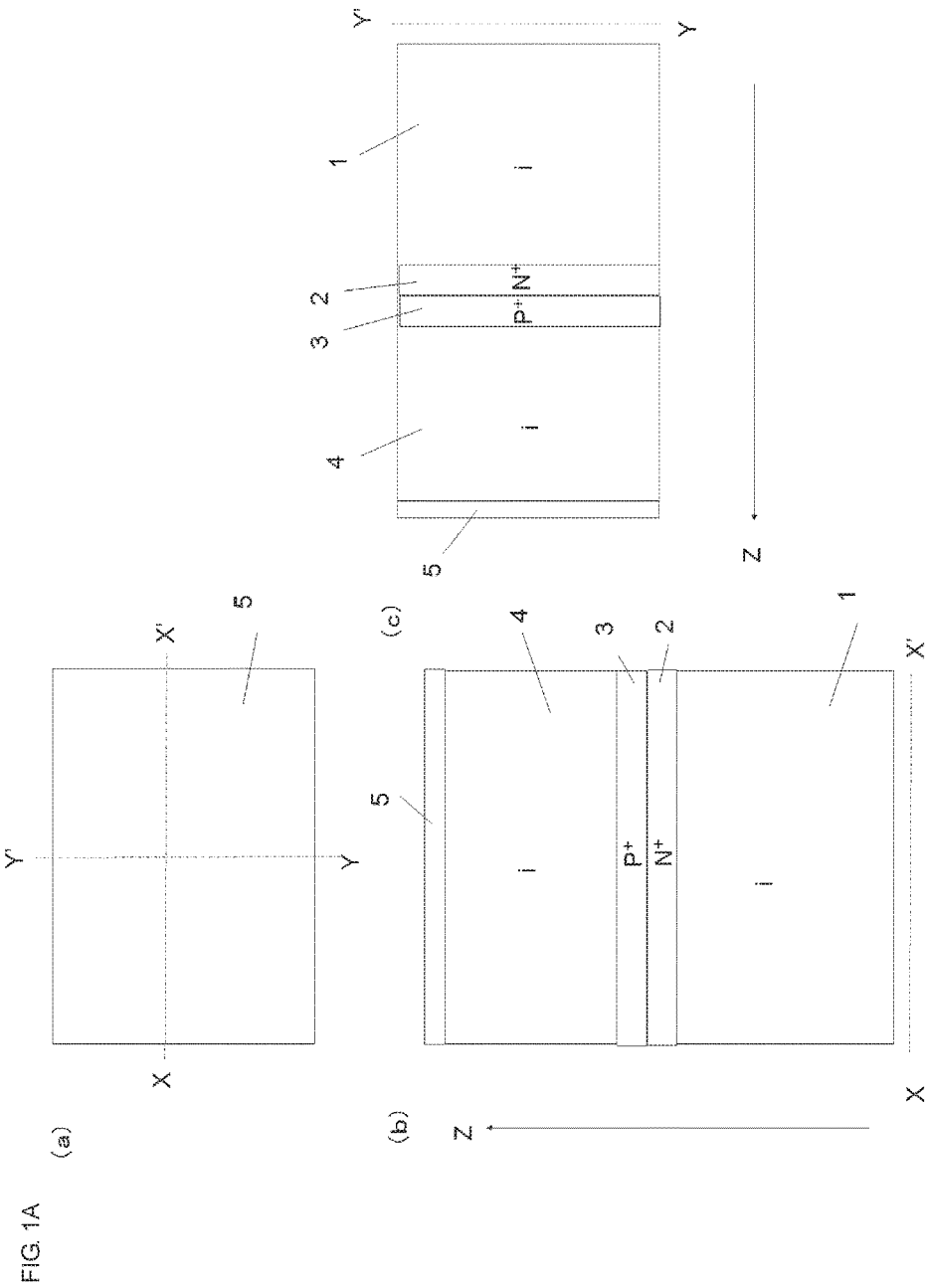
FIG. 1A includes a plan view (a) and cross-sectional views (b) and (c) of a CMOS inverter circuit illustrating a method for manufacturing an SGT-including semiconductor device according to a first embodiment of the present invention.

FIG. 1A includes a plan view and cross-sectional views illustrating a first step of an SGT-including CMOS inverter circuit. Part (a) is a plan view, part (b) is a cross-sectional view taken along line X-X' in (a), and part (c) is a cross-sectional view taken along line Y-Y' in (a). The relationship between the diagrams in part (a), part (b), and part (c) is the same for other drawings referred in the description below.

As illustrated in FIG. 1A, an $N^+$ region 2 containing a donor impurity such as arsenic (As) is formed on an i-layer substrate 1 by an ion implantation method or an epitaxial growth method. Next, a $P^+$ region 3 containing an acceptor impurity such as boron (B) is formed on the $N^+$ region 2 by an ion implantation method or an epitaxial growth method. An i-region 4 is formed on the P+ region 3 by an epitaxial growth method. Then a SiO₂ layer 5 is formed on the i-region 4 by a thermal oxidation method.

Figure 1B:
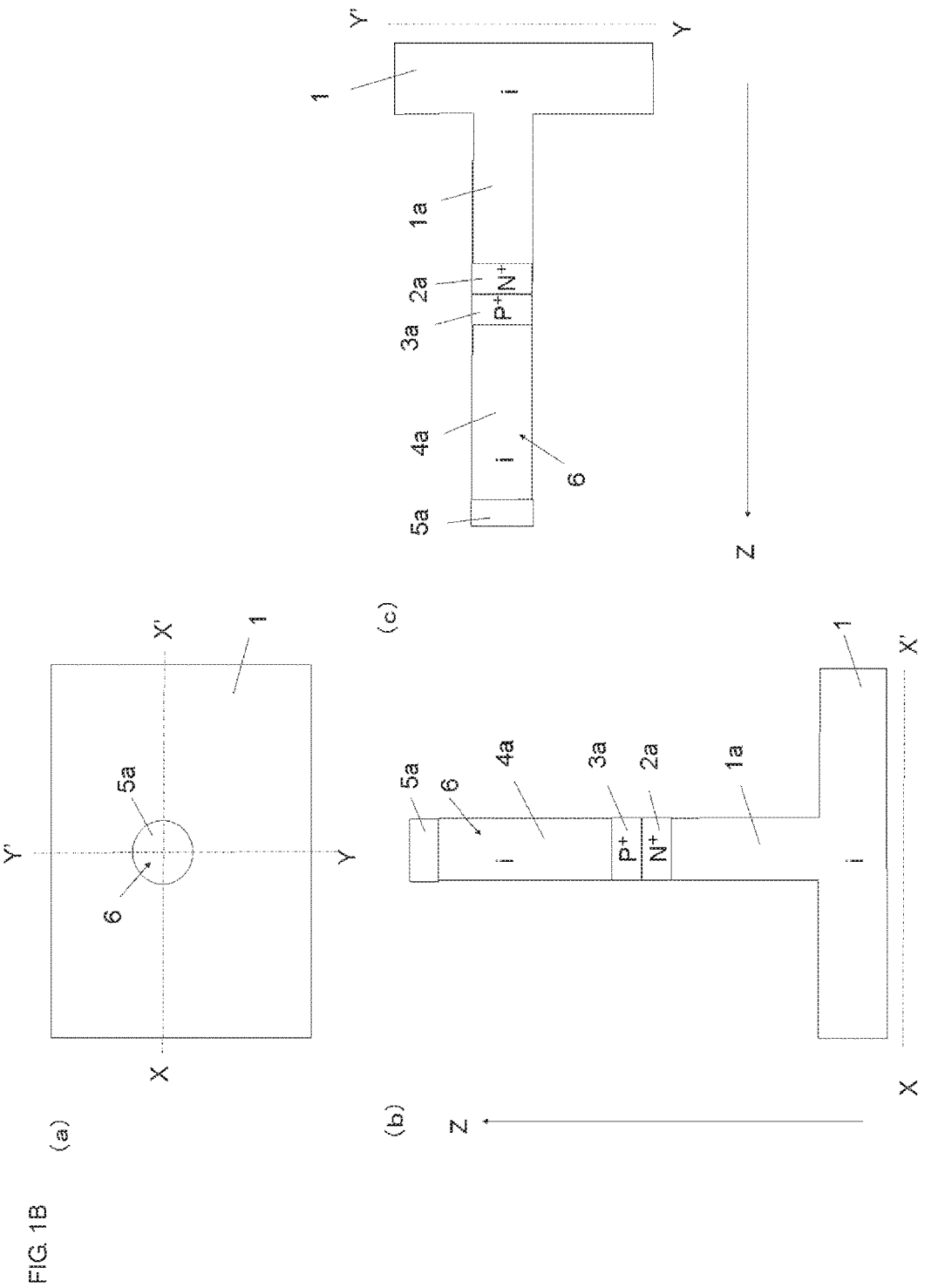
FIG. 1B includes a plan view (a) and cross-sectional views (b) and (c) of a CMOS inverter circuit illustrating the method for manufacturing an SGT-including semiconductor device according to the first embodiment of the present invention.
Figure 1C:
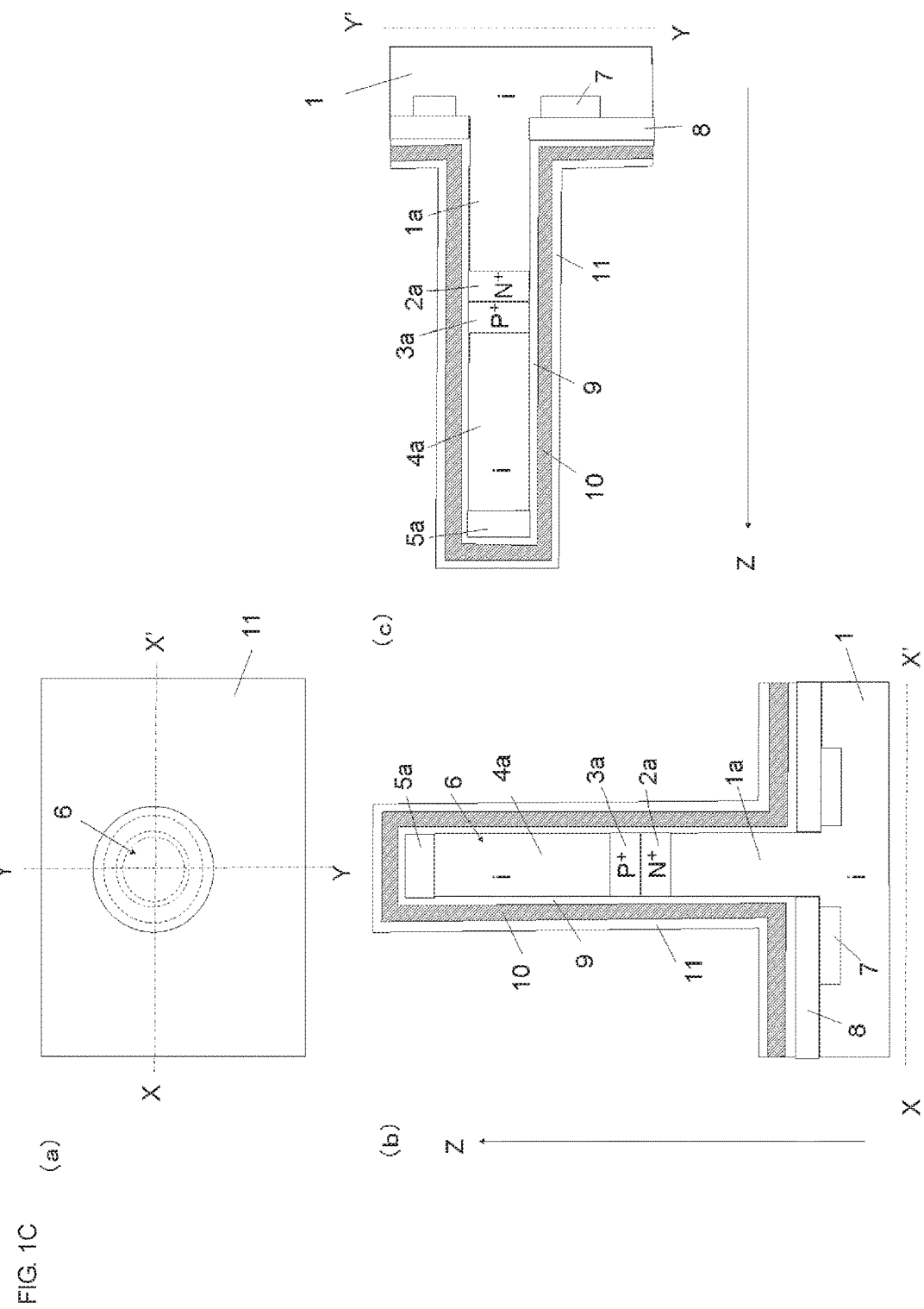
FIG. 1C includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1B, the SiO₂ layer 5 is etched by performing a lithographic method and a reactive ion etching (RIE) method so as to form a SiO₂ layer 5a. The i-region 4, the P+ region 3, the N+ region 2, and the i-layer substrate 1 are then etched by a RIE method using the SiO₂ layer 5a as a mask so as to form a Si pillar 6 that includes an i-region 4a, a P+ region 3a, a N+ region 2a, and an i-region 1a. The cross-sectional shape of the Si pillar 6 is preferably round as illustrated in (a).

Next, as illustrated in FIG. 10, an N+ region 7 is formed in the surface of the i-layer substrate 1 at the outer periphery of the Si pillar 6 by an ion implantation method. Then a SiO₂ film is deposited by a chemical vapor deposition (CVD) method, the surface is planarized by a mechanical chemical polishing (MCP) method, and the SiO₂ film is etched by an etch back method so as to have a SiO₂ layer 8 remain on the i-layer substrate 1 at the outer periphery of the Si pillar 6. Then atomic layer deposition (ALD) is employed to coat the entire Si pillar 6 and SiO₂ layer 8 with a hafnium oxide (HfO₂) layer 9 and a titanium nitride (TiN) layer 10. Then the Si pillar 6 and the entire peripheral area of the Si pillar 6 are coated with a SiO₂ layer 11 by a CVD method.

Figure 1D:
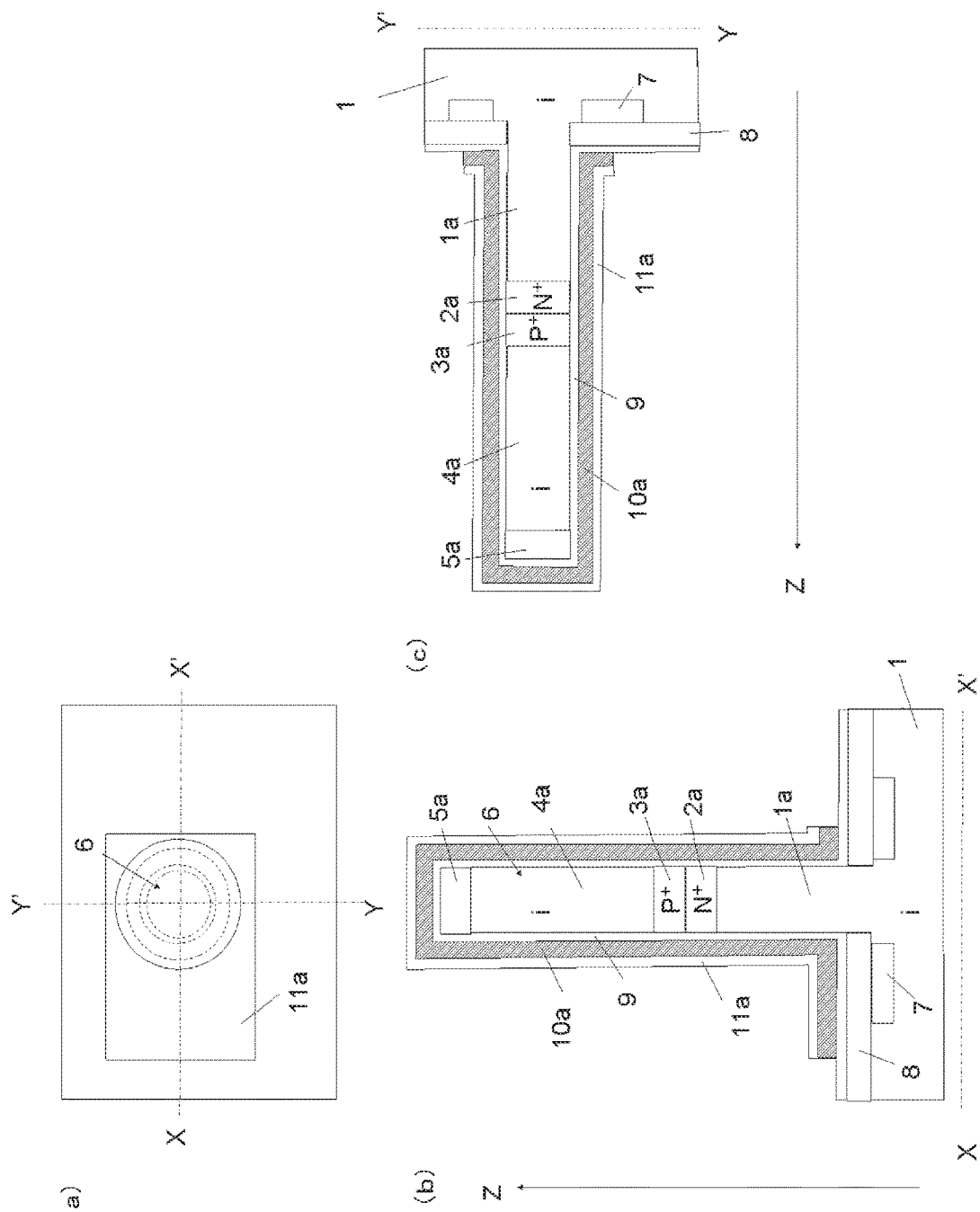
FIG. 1D includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1D, the SiO₂ layer 11 and the titanium nitride (TiN) layer 10 are etched by a RIE method using a mask formed of a resist formed by a lithographic method so as to form a SiO₂ layer 11a and a TiN layer 10a that cover the Si pillar 6 and connect to the upper part of the SiO₂ layer 8.

Figure 1E:
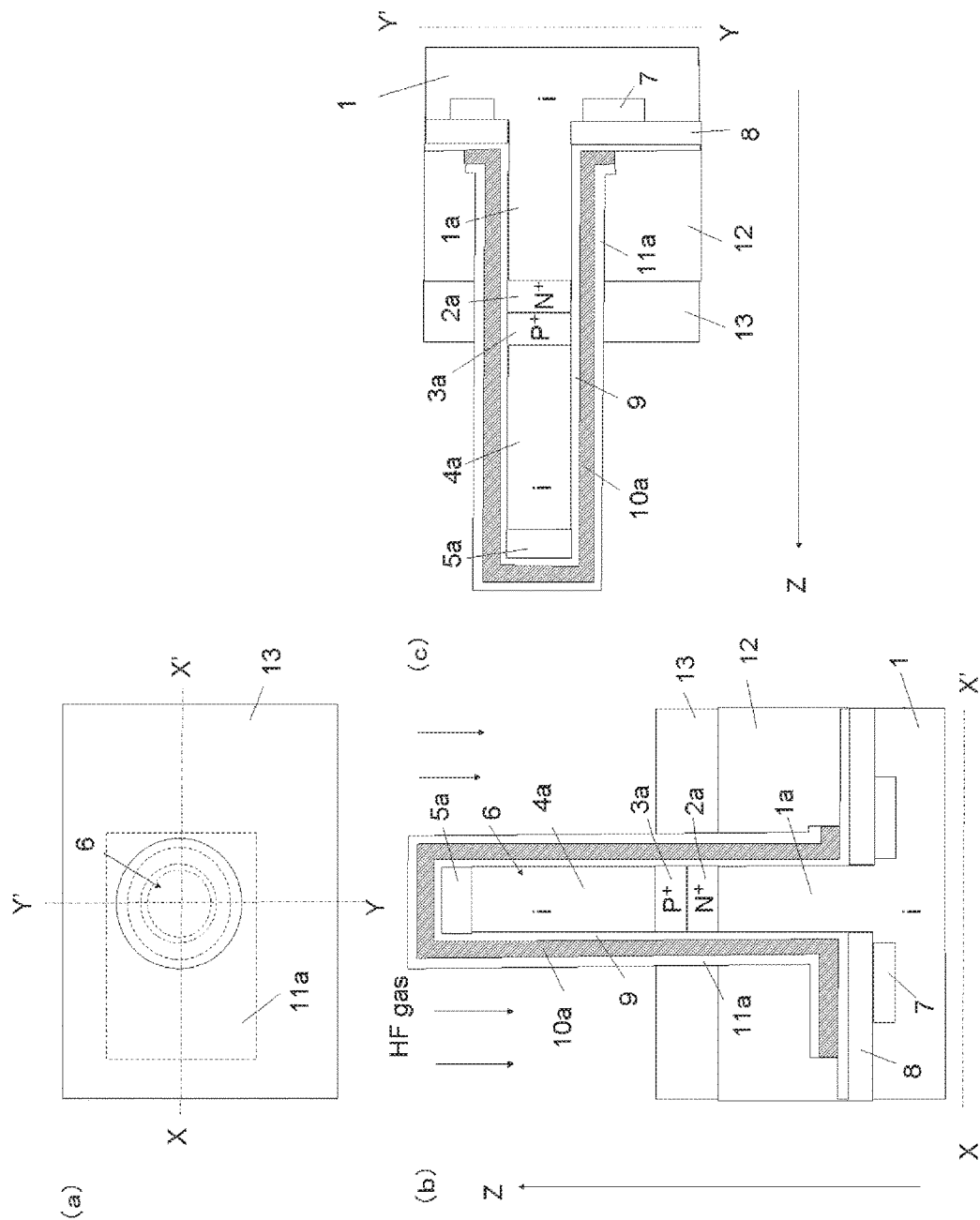
FIG. 1E includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1E, a silicon nitride (SiN) layer 12 is formed at the outer periphery of the Si pillar 6. The SiN layer 12 is formed so that the position of its surface is at the same height as the lower end of the N+ region 2a formed in the Si pillar 6. Then a resist layer 13 is formed on the SiN layer 12. The resist layer 13 is formed so that the position of its surface is at the same height as the upper end of the P+ region 3a. The resist layer 13 is formed by applying a resist material over the entire i-layer substrate 1 and performing a heat treatment at 200° C., for example, so as to increase the flowability of the resist material and to allow the resist material to evenly collect on the SiN layer 12 on the outer side of the Si pillar 6. Then hydrogen fluoride gas (hereinafter referred to as "HF gas") is supplied to all parts. Subsequently, a heating environment of 180° C. is created so as to thermally diffuse the HF gas into the resist layer 13 and ionize the HF gas by the moisture contained in the resist layer 13. As a result, hydrogen fluoride ions (hereinafter referred to as "HF ions") (HF₂⁺) are formed. The HF ions thermally diffuse into the resist layer 13 and etch the SiO₂ layer 11a in contact with the resist layer 13 (refer to Non Patent Literature 3 for the mechanism of etching). In contrast, the SiO₂ layer 11a not in contact with the resist layer 13 remains substantially unetched. Then the resist layer 13 is removed.

Figure 1F:
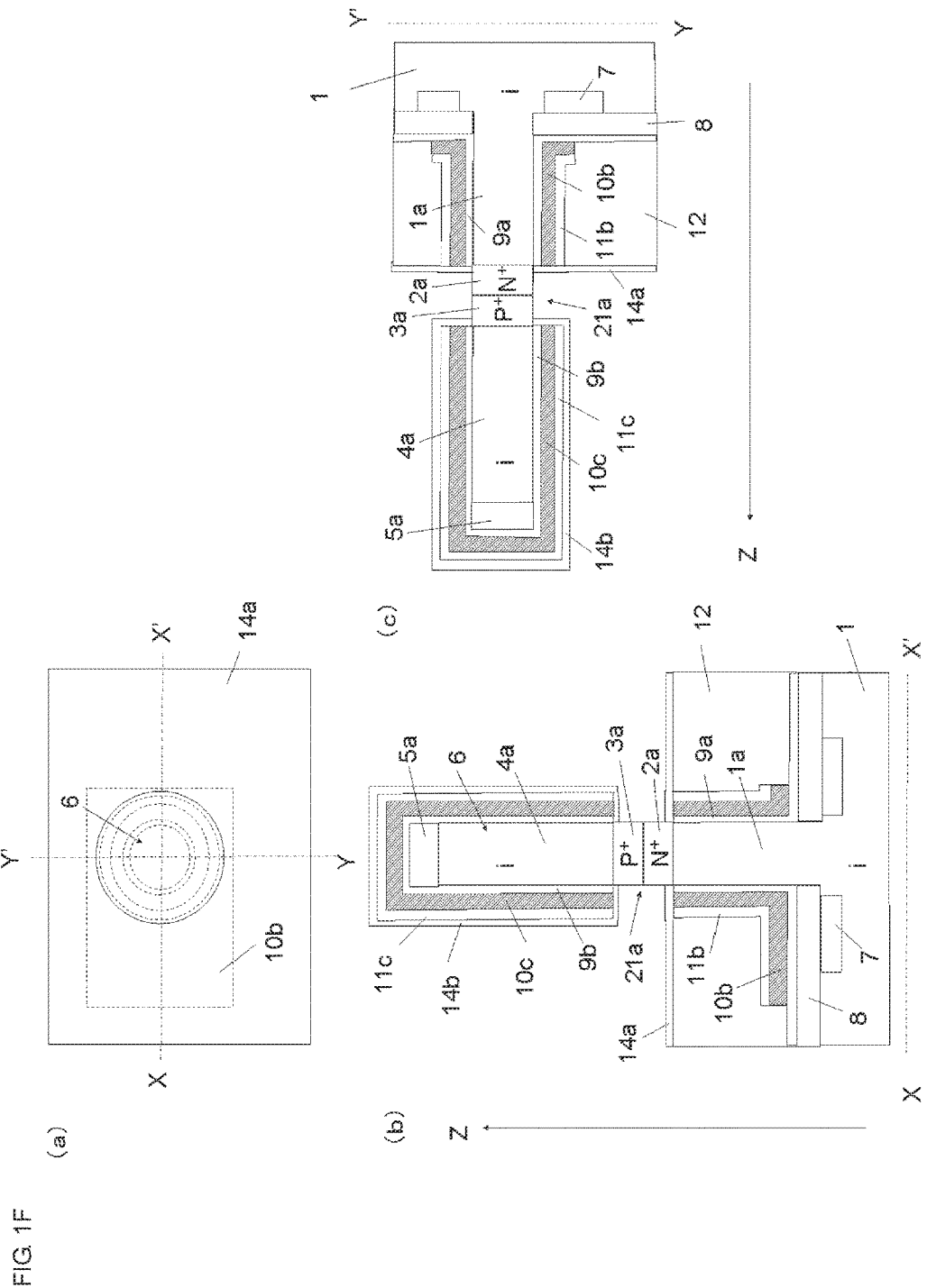
FIG. 1F includes a plan view (a) and cross-sectional views (b) and (c) of a CMOS inverter circuit illustrating the method for manufacturing an SGT-including semiconductor device according to the first embodiment of the present invention.

As illustrated in FIG. 1F, the SiO₂ layer 11a is divided into a SiO₂ layer 11b in a region covered with the SiN layer 12 and a SiO₂ layer 11c in an upper region of the Si pillar 6. Then the TiN layer 10a is etched by using the SiO₂ layers 11b and 11c as a mask. As a result, the TiN layer 10a is divided into a TiN layer 10b covered with the SiO₂ layer 11b and a TiN layer 10c covered with the SiO₂ layer 11c in the upper region of the Si pillar 6. Then the HfO₂ layer 9 is etched by using the TiN layers 10b and 10c as a mask so as to divide the HfO₂ layer 9 into a HfO₂ layer 9a covered with the TiN layer 10b and a HfO₂ layer 9b in the upper region of the Si pillar 6. A SiO₂ film is then deposited over the entire Si pillar 6 and SiN layer 12. Application of a resist layer, a heat treatment at 200° C., supplying of HF gas, etching of the SiO₂ film by a heat treatment at 180° C., and removal of the resist layer are performed as in the method indicated in FIG. 1E so as to form an opening 21a that exposes the outer peripheries of the N+ region 2a and the P+ region 3a. In forming the opening 21a, a SiO₂ layer 14a remains on the HfO₂ layer 9a, the TiN layer 10b, the SiO₂ layer 11b, and the SiN layer 12 and a SiO₂ layer 14b remains so as to surround the HfO₂ layer 9b, the TiN layer 10c, and the SiO₂ layer 11c at the upper portion of the Si pillar 6.

Figure 1G:
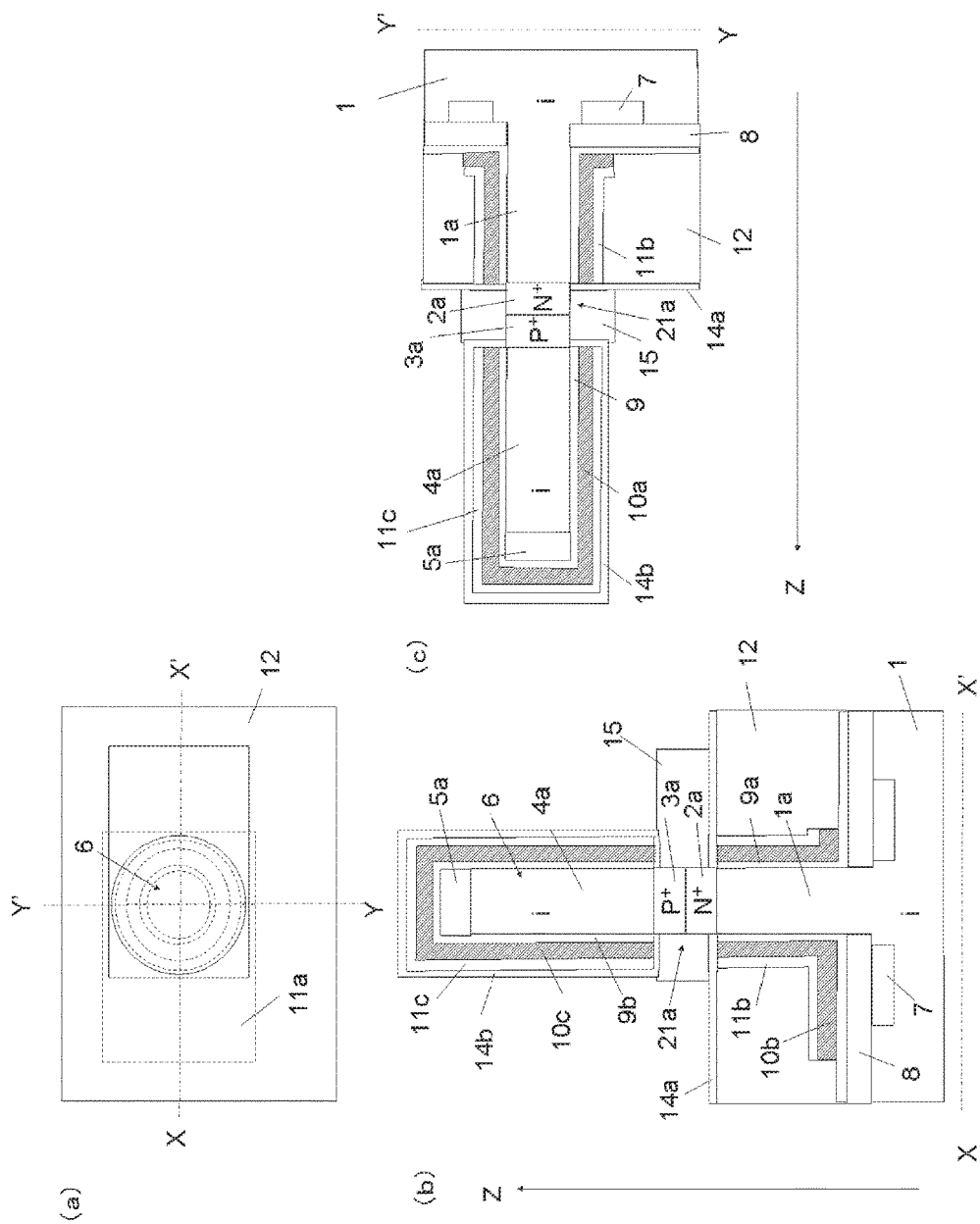
FIG. 1G includes a plan view (a) and cross-sectional views (b) and (c) of a CMOS inverter circuit illustrating the method for manufacturing an SGT-including semiconductor device according to the first embodiment of the present invention.

As illustrated in FIG. 1G, a polycrystalline silicon (hereinafter referred to as "poly Si") film is deposited by a CVD method so that the surface position thereof is higher than the Si pillar 6 and then the surface is planarized by a CMP method. The poly Si film is etched by an etch back method so that the height of the surface of the poly Si film is close to the upper end of the opening 21a. Then poly Si etching is performed by a lithographic method and RIE so as to form a poly Si layer 15 that is in contact with the N+ region 2a and the P+ region 3a and is connected to the outer periphery of the Si pillar 6.

Figure 1H:
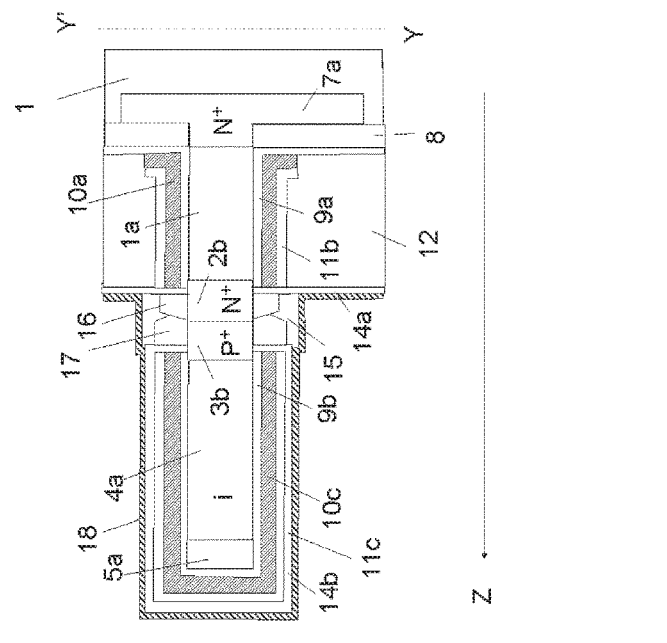
FIG. 1H includes a plan view (a) and cross-sectional views (b) and (c) of a CMOS inverter circuit illustrating the method for manufacturing an SGT-including semiconductor device according to the first embodiment of the present invention.
Figure 1H:
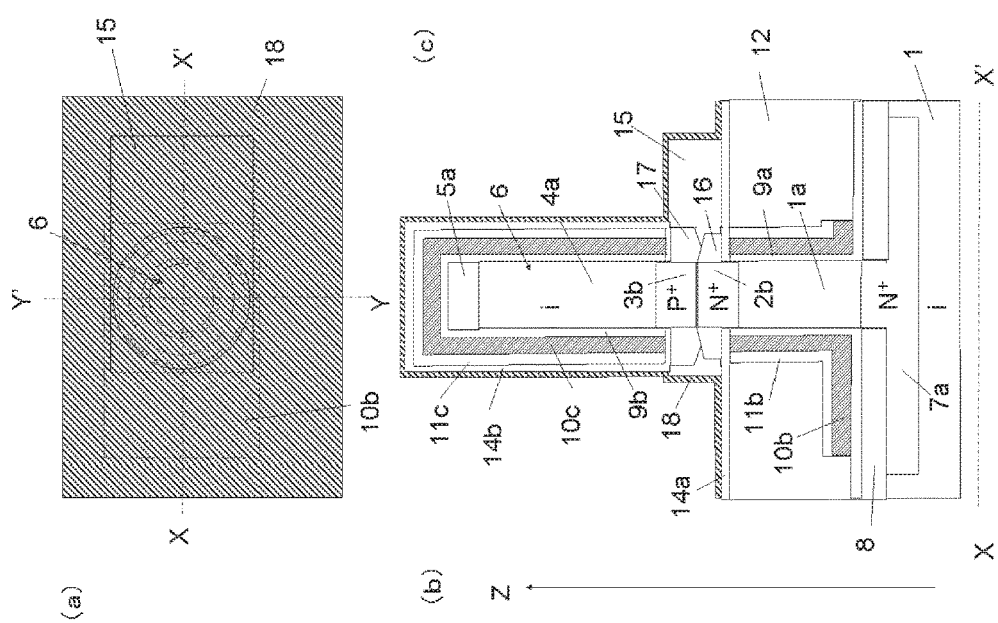

Then, as illustrated in FIG. 1H, a heat treatment at, for example, 850° C. is performed so as to have the donor impurity (As) in the N+ region 2a and the acceptor impurity (B) in the P+ region 3a to thermally diffuse into the poly Si layer 15. As a result, an N+ region 16 and a P+ region 17 are formed in the poly Si layer 15. The diffusion coefficient of As atoms into Si ($5 \times 10^{-16}$ cm²/sec) is smaller than the diffusion coefficient of B ($1 \times 10^{-14}$ cm²/sec) and the solubility limit of As atoms in Si ($2 \times 10^{21}$/cm³) is larger than the solubility limit of B atoms in Si ($4 \times 10^{20}$/cm³). Thus, when As is contained in the N+ region 2a and B in the P+ region 3a up to their solubility limits, the outer peripheral end of the P+ region 17 in the poly Si layer 15 comes to be located on the outer side of the N+ region 16. Moreover, impurities contained in the N+ region 2a, the N+ region 7, and the P+ region 3a diffuse into the Si pillar 6 and the i-layer substrate 1. As a result, the N+ region 2a turns into an N+ region 2b, the P+ region 3a turns into a P+ region 3b, and the N+ region 7 turns into an N+ region 7a. The shape of the portion where the N+ region 16 comes into contact with the P+ region 17 is determined by the diffusion pattern of N+ region 16 having a high donor impurity concentration. Then a nickel (Ni) layer 18 is deposited on all parts by an ALD method.

Figure 1I:
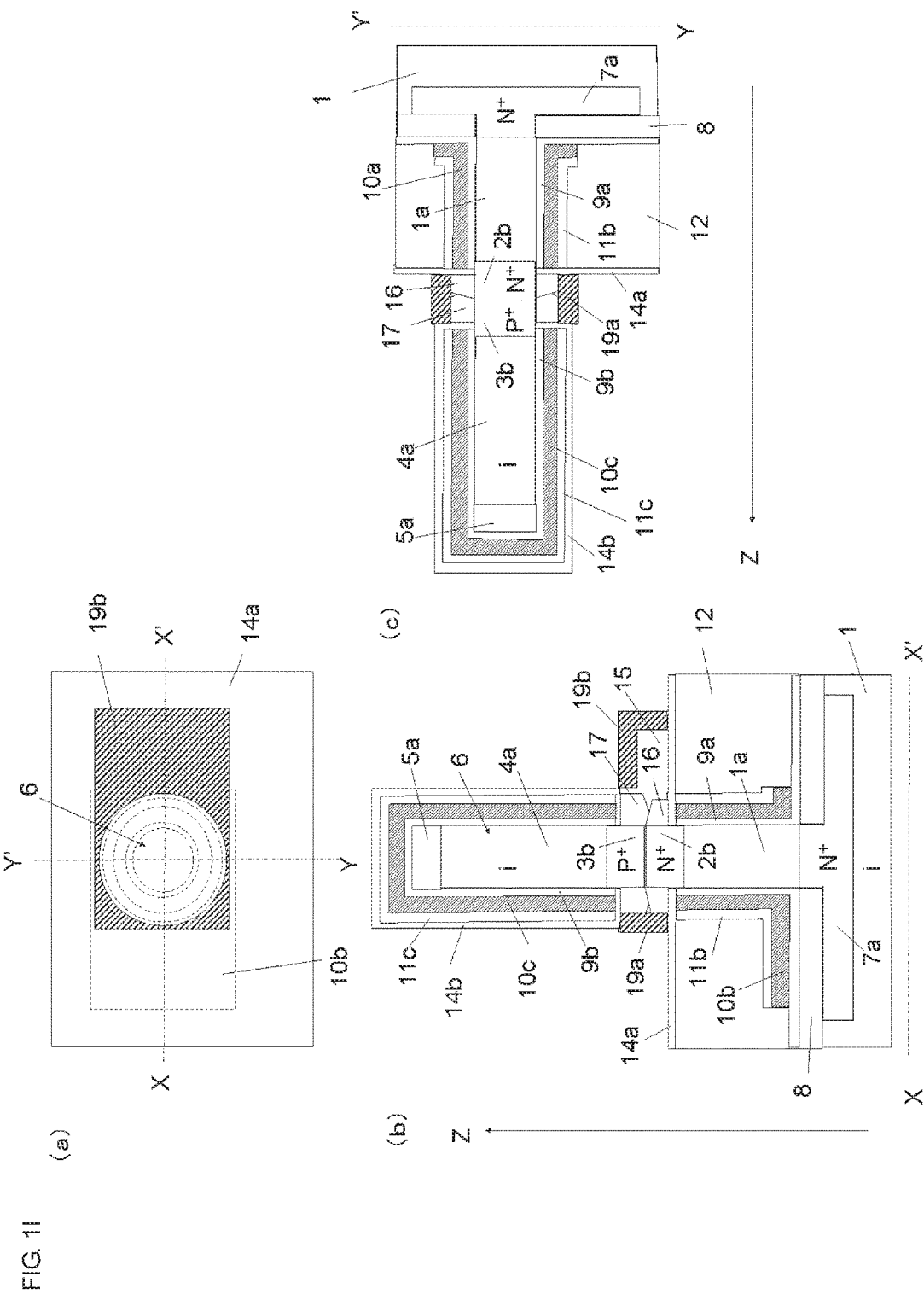
FIG. 1I includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1I, a heat treatment is performed at 650° C., for example, so as to form nickel silicide (NiSi) layers 19a and 19b in the upper surface layer of the poly Si layer 15. The NiSi layer 19a is formed in a side surface of the poly Si layer 15 and the NiSi layer 19b is formed in the surface layer and the side surface of the poly Si layer 15. The NiSi layers 19a and 19b are formed so as to be connected to each other and the NiSi layer 19a comes into contact with the N+ region 16 and the P+ region 17. As illustrated in FIG. 1I(c), the NiSi layer 19a formed in the side surface of the poly Si layer 15 is formed so as to be in contact with the N+ region 16 and the P+ region 17 even in the Y-Y' direction in plan view. Then the Ni layer 18 is removed.

Figure 1J:
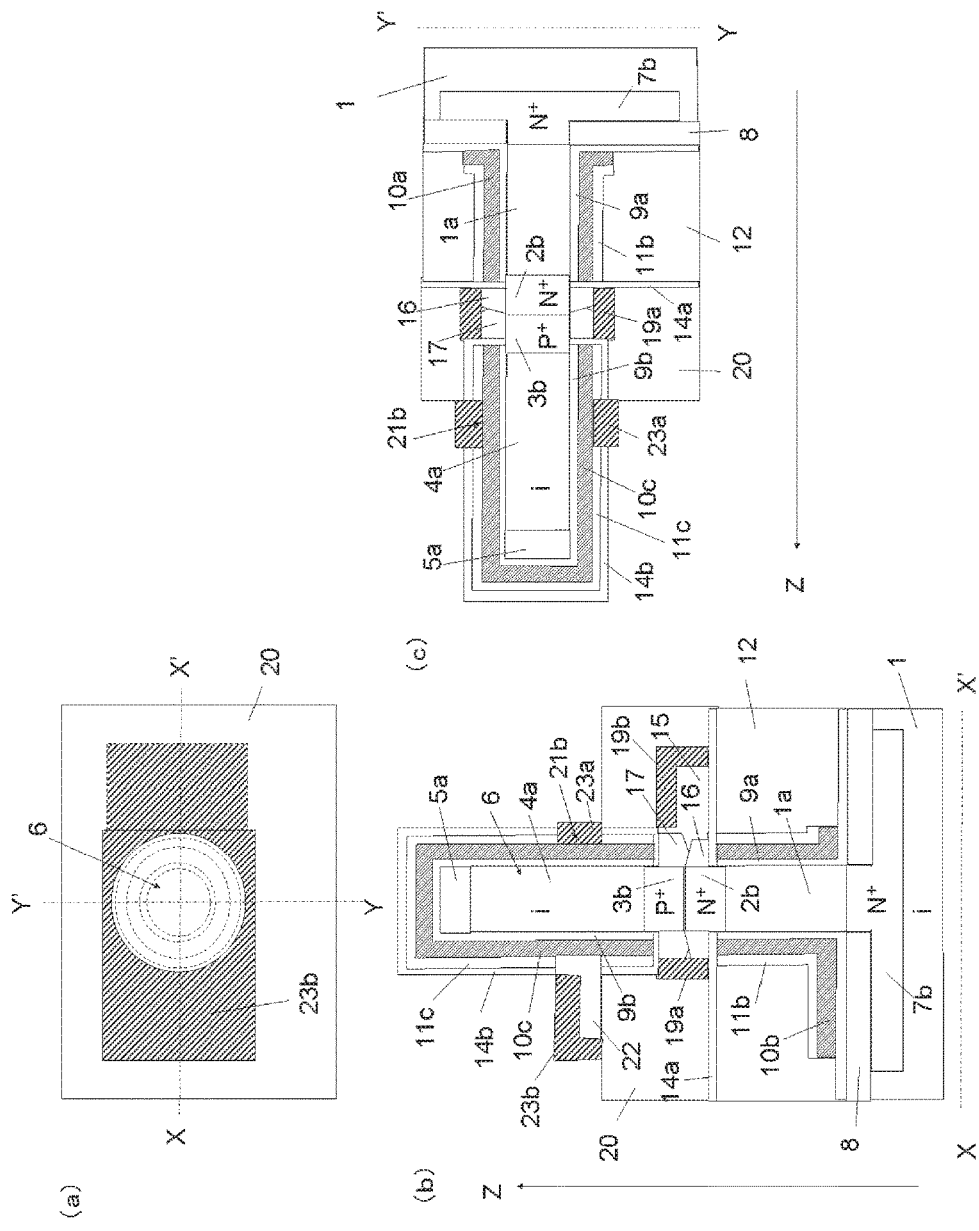
FIG. 1J includes a plan view (a) and cross-sectional views (b) and (c) of a CMOS inverter circuit illustrating the method for manufacturing an SGT-including semiconductor device according to the first embodiment of the present invention.

As illustrated in FIG. 1J, a SiN layer 20 having a surface position located in the middle position in the height direction of the TiN layer 10c is formed by the same method as the method for forming the SiN layer 12. Then an opening 21b is formed at the outer periphery of the TiN layer 10c by the same method as the method for forming the opening 21a. A poly Si layer 22 is then formed by the same method as the method for forming the poly Si layer 15. Then a NiSi layer 23a is formed in the side surface of the poly Si layer 22 and a NiSi layer 23b is formed in the upper surface layer and the side surface of the poly Si layer 22 by the same method as the method for forming the NiSi layers 19a and 19b. The NiSi layers 23a and 23b are connected to each other. The NiSi layer 23a is in contact with the TiN layer 10c. As illustrated in FIG. 1J(c), the NiSi layer 23a formed in the side surface of the poly Si layer 22 is formed to contact the TiN layer 10c also in the Y-Y' direction in plan view.

Figure 1K:
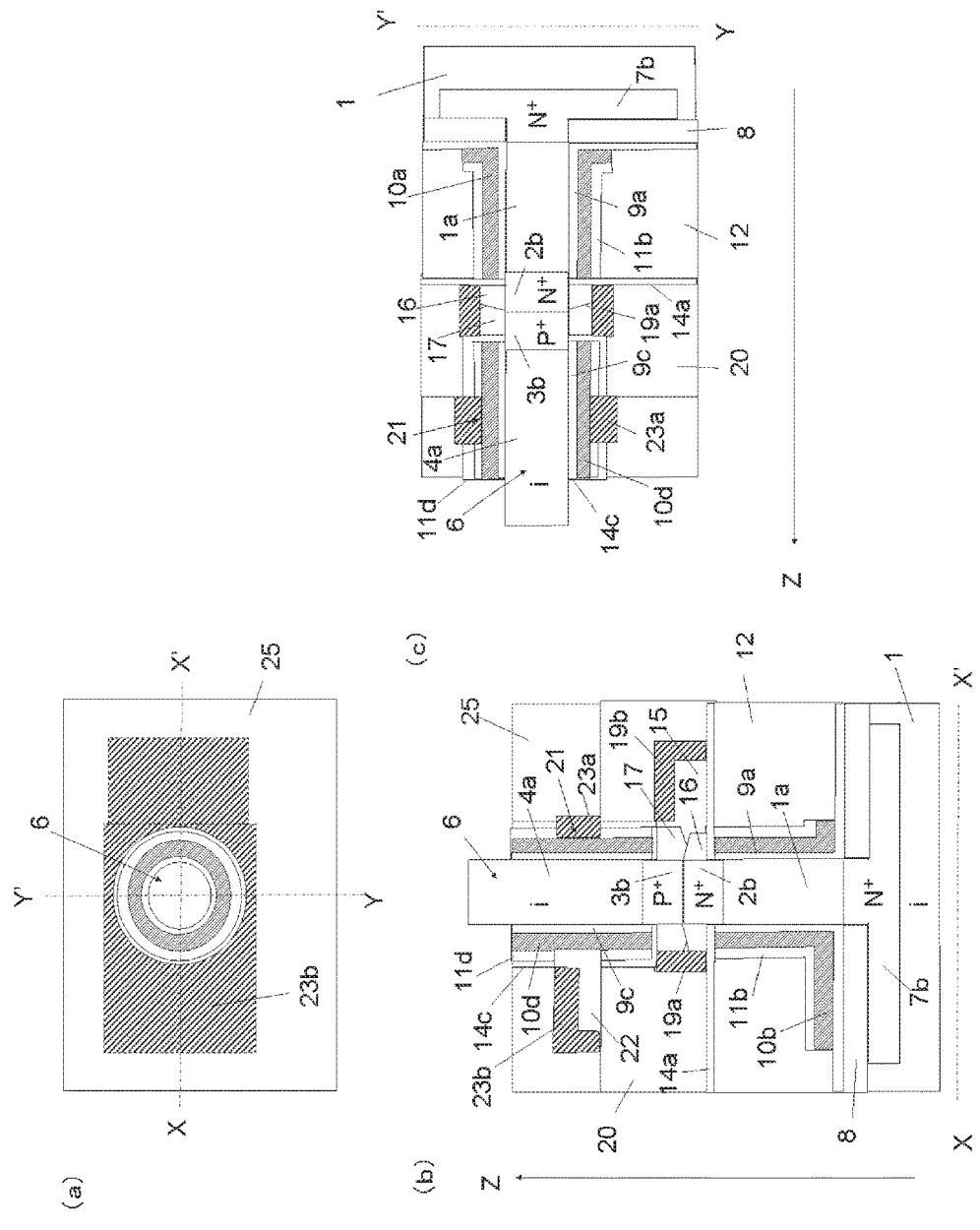
FIG. 1K includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1K, a resist film is applied to all parts and the entire resist film is etched back evenly from the surface so as to form a resist layer 25 having a surface positioned to be higher than the surface of the poly Si layer 22 and lower than the top portion of the Si pillar 6. The $SiO_2$ layer 14b, the $SiO_2$ layer 11c, the TiN layer 10c, and the $HfO_2$ layer 9b are etched by using the resist layer 25 as a mask to form a $SiO_2$ layer 14c, a $SiO_2$ layer 11d, a TiN layer 10d, and a $HfO_2$ layer 9c. Then the resist layer 25 is removed.

Figure 1L:
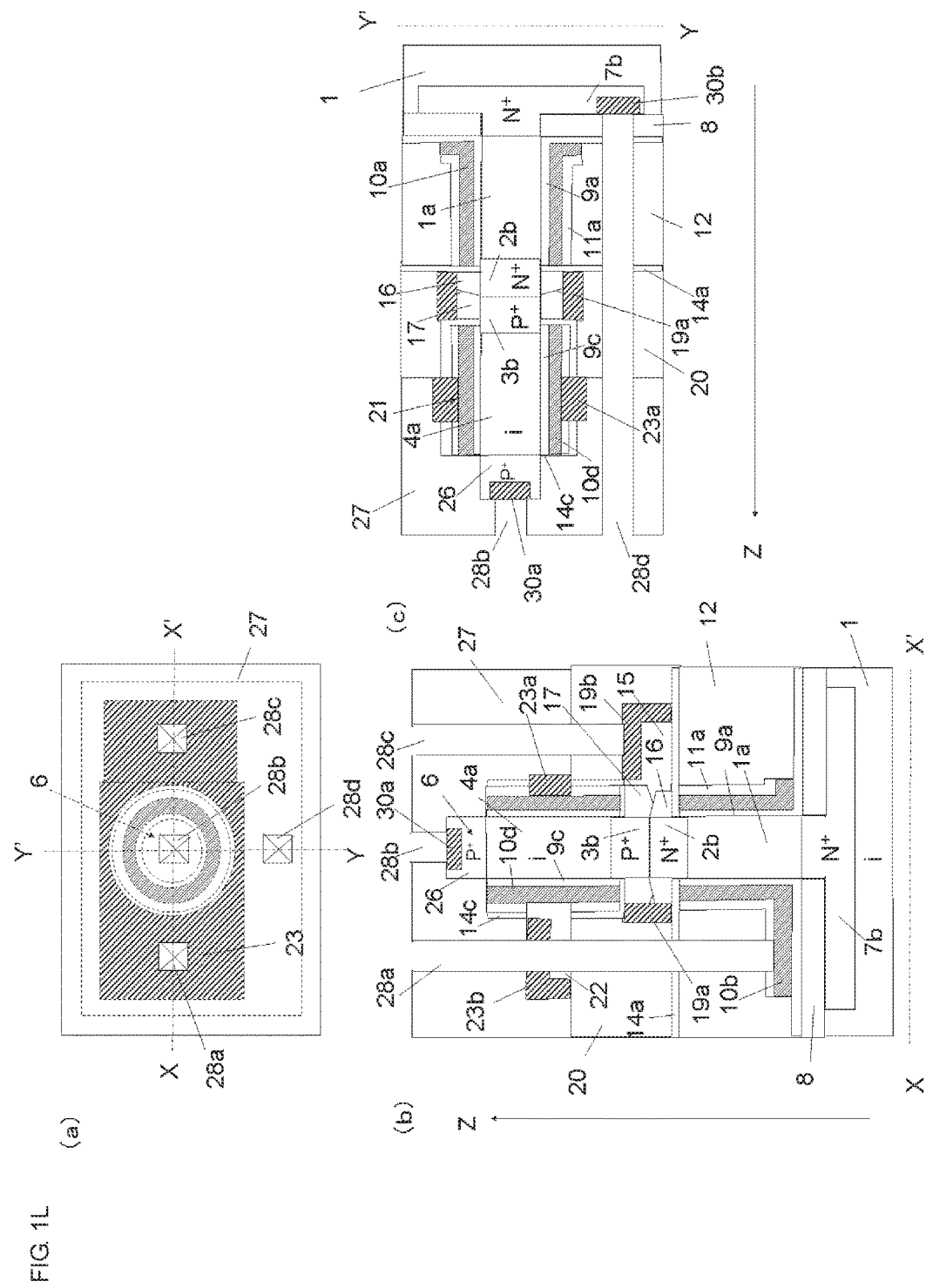
FIG. 1L includes a plan view (a) and cross-sectional views (b) and (c) of a CMOS inverter circuit illustrating the method for manufacturing an SGT-including semiconductor device according to the first embodiment of the present invention.

As illustrated in FIG. 1L, a $P^+$ region 26 is formed in the top portion of the Si pillar 6 by performing a boron (B) ion implantation method by using the $SiO_2$ layer 14c, the $SiO_2$ layer 11d, the TiN layer 10d, and the $HfO_2$ layer 9c as a mask. Subsequently, a $SiO_2$ layer 27 is formed on all parts by a CVD method. A contact hole 28b is formed on the top portion of the Si pillar 6 by a lithographic method and a RIE method and a contact hole 28d is formed on an $N^+$ region 7b. A NiSi layer 30a is formed in the top portion of the Si pillar 6 at the bottom of the contact hole 28b and a NiSi layer 30b is formed in the surface layer of the $N^+$ region 7b at the bottom of the contact hole 28d. A contact hole 28a is formed on the TiN layer 10b so as to penetrate the poly Si layer 22 and a contact hole 28c is formed on the NiSi layer 19b in the upper surface layer of the poly Si layer 15.

Figure 1M:
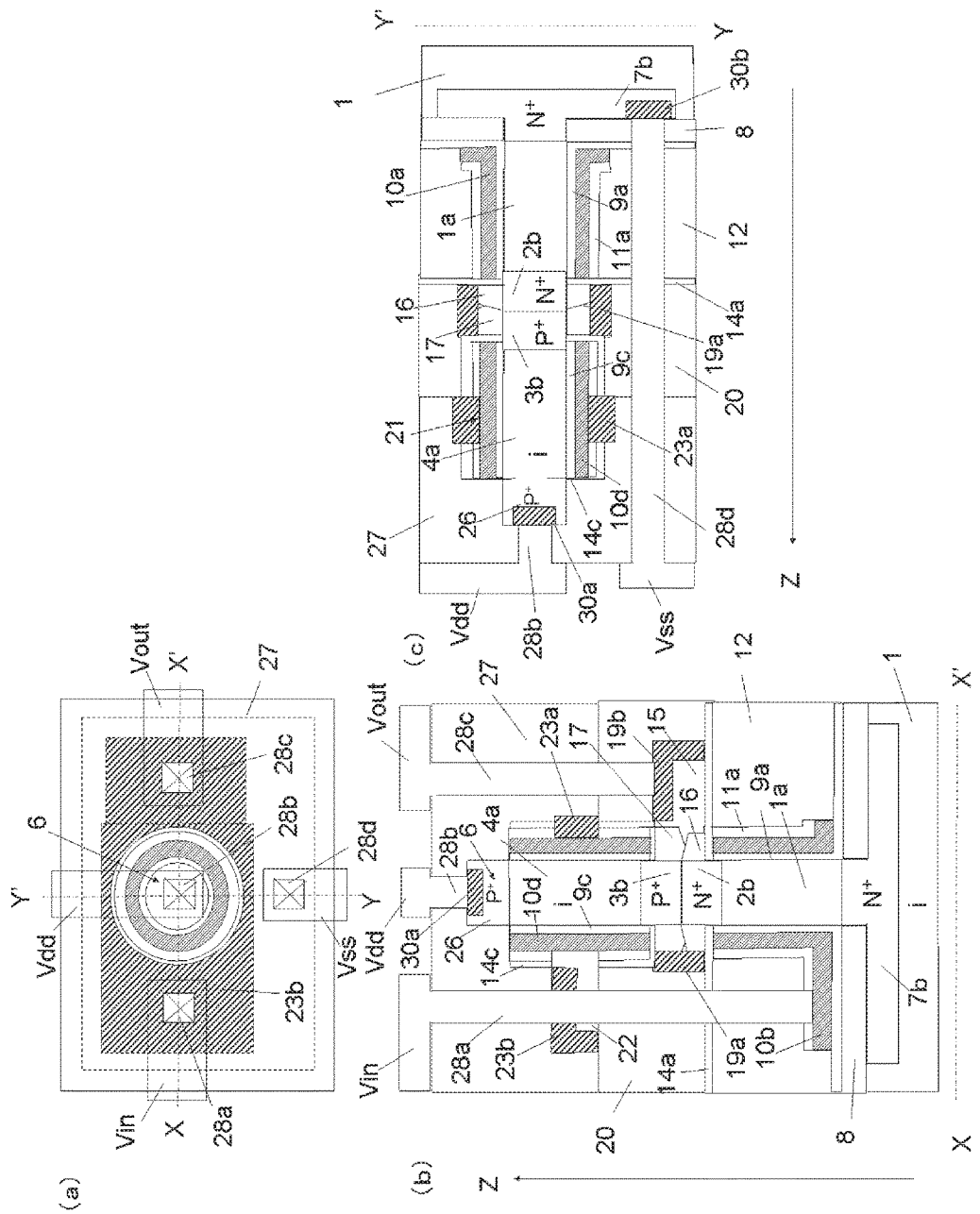
FIG. 1M includes a plan view (a) and cross-sectional views (b) and (c) of a CMOS inverter circuit illustrating the method for manufacturing an SGT-including semiconductor device according to the first embodiment of the present invention.

Next, as illustrated in FIG. 1M, an input wiring metal layer Vin electrically connected to the NiSi layer 23 b, the poly Si layer 22, and the TiN layer 10 b through the contact hole 28 a is formed and a power supply wiring metal layer Vdd electrically connected to the NiSi layer 30 a and the $P^+$ region 26 in the top portion of the Si pillar through the contact hole 28 b is formed. An output wiring metal layer Vout electrically connected to the NiSi layer 19 a, the NiSi layer 19 b, the $N^+$ region 2 b, the $N^+$ region 16, the $P^+$ region 3 b, the $P^+$ region 17, and the poly Si layer 15 through the contact hole 28 c is formed. A ground wiring metal layer Vss electrically connected to the NiSi layer 30 b and the $N^+$ region 7 b through the contact hole 28 d is formed.

By using the manufacturing method described above, a CMOS inverter circuit having an N-channel SGT and a P-channel SGT is formed, in which the N-channel SGT includes the i-region 1a serving as a channel in the lower portion of the Si pillar 6, the $HfO_2$ layer 9a surrounding the outer periphery of the i-region 1a and serving as a gate insulating layer, the TiN layer 10b surrounding the outer periphery of the $HfO_2$ layer 9a and serving as a gate conductor layer, the $N^+$ region 7b serving as a source located in the lower portion of the i-region 1a, and the $N^+$ region 2b serving as a drain located on the i-region 1a and in which the P-channel SGT includes the i-region 4a serving as a channel in the upper portion of the Si pillar 6, the $HfO_2$ layer 9c surrounding the outer periphery of the i-region 4a and serving as a gate insulating layer, the TiN layer 10d surrounding the outer periphery of the $HfO_2$ layer 9c and serving as a gate conductor layer, the $P^+$ region 3b serving as a source located in the lower portion of the i-region 4a, and the $P^+$ region 26 serving as a drain located on the i-region 4a.

The CMOS inverter circuit of the first embodiment exhibits the following effects.

1. The $N^+$ region 2b and the $P^+$ region 3b in the central portion of the Si pillar 6 are connected to the NiSi layers 19a and 19b through the $N^+$ region 16 and the $P^+$ region 17 formed so as to spread inside the poly Si layer 15 on the outer side of the $N^+$ region 2b and the $P^+$ region 3b. As such, the NiSi layers 19a and 19b, which cause bending and collapsing of the Si pillar 6 due to large stress-induced strain in the Si pillar 6 generated by a difference in thermal expansion coefficient from Si, are formed within the poly Si layer 15 formed so as to surround the outer periphery of the Si pillar 6. Accordingly, bending and collapsing of the Si pillar 6 are prevented.

2. Since the poly Si layer 15 is formed to surround the Si pillar 6, the poly Si layer 15 serves as a material layer for preventing bending and collapsing of the Si pillar 6. Thus, bending and collapsing of the Si pillar 6 can be more effectively prevented.

3. The NiSi layer 19a formed in the side surface of the poly Si layer 15 contributes to establishing a low-resistance connection between the $N^+$ region 2b and the $P^+$ region 3b and the NiSi layer 19b formed in the upper surface layer of the poly Si layer 15 contributes to establishing a low-resistance connection to the output wiring metal layer Vout connected to the contact hole 28c formed on the NiSi layer 19b. Since the NiSi layers 19a and 19b are connected to each other, the $N^+$ region 2b and the $P^+$ region 3b are connected to the output wiring metal layer Vout at low resistance. Accordingly, even when the NiSi layer 19b in the upper surface layer of the poly Si layer 15 is not directly connected to the $P^+$ region 17 and the $N^+$ region 16, a low-resistance connection between the $N^+$ region 2b and the output wiring metal layer Vout and between the $P^+$ region 3b and the output wiring metal layer Vout can be securely established.

4. In the poly Si layer 15 on the left side of the Si pillar 6 illustrated in FIG. 1I(b), the NiSi layer 19a is in contact with the $N^+$ region 16 and the $P^+$ region 17 and is formed to spread inward from the side surface of the poly Si layer 15. Since the $N^+$ region 16 and the $P^+$ region 17 are surrounded by the NiSi layer 19a, the effect of sweeping the impurity contained in the NiSi layer 19a is accelerated and the donor and acceptor impurities gather around the border between the NiSi layer 19a and the $N^+$ region 16 and the border between the NiSi layer 19a and the $P^+$ region 17. As a result, the contact resistance between the NiSi layer 19a and the $N^+$ region 16 and between the NiSi layer 19a and the $P^+$ region 17 can be further decreased.

5. The poly Si layer 22 connected to the TiN layer 10d is formed so as to surround the Si pillar 6 and thus serves as a material layer that prevents bending or collapsing of the Si pillar 6. Accordingly, bending and collapsing of the Si pillar 6 can be prevented.

6. The NiSi layer 23a formed in the side surface of the poly Si layer 22 is connected to the TiN layer 10d at low resistance and the NiSi layer 23b formed in the upper surface layer and the side surface of the poly Si layer 22 is connected at low resistance to the input wiring metal layer Vin connected to the contact hole 28a penetrating the NiSi layer 23b. Since the NiSi layer 23a and the NiSi layer 23b are connected to each other, the TiN layer 10d is connected to the input wiring metal layer Vin at low resistance. Accordingly, even when the NiSi layer 23b in the upper surface layer of the poly Si layer 22 is not directly connected to the TiN layer 10d, a low-resistance connection between the TiN layer 10d and the input wiring metal layer Vin can be securely established.

7. As illustrated in FIG. 1M(c), the NiSi layer 19a formed in the side surface of the poly Si layer 15 is formed so as to contact the N$^+$ region 16 and the P$^+$ region 17 also in the Y-Y' direction when viewed in plan. Accordingly, the low-resistance connection between the NiSi layer 19a and the P$^+$ region 17 and the low-resistance connection between the NiSi layer 19a and the N$^+$ region 16 are established in three directions when viewed in plan. Similarly, the NiSi layer 23a formed in the side surface of the poly Si layer 22 is formed to contact the TiN layer 10c even in the Y-Y' direction when viewed in plan. Accordingly, a low-resistance connection between the NiSi layer 23a and the TiN layer 10d is established in three directions when viewed in plan.

Second Embodiment

A method for manufacturing a CMOS inverter circuit, which is an SGT-including semiconductor device, according to a second embodiment of the present invention will now be described with reference to FIGS. 2A to 2E.

As illustrated in FIG. 2A, a N$^+$ region 2 containing a donor impurity such as arsenic (As), for example, is formed on an i-layer substrate 1 by an ion implantation method or an epitaxial growth method. An i-region 4 is then formed on the N$^+$ region 2 by an epitaxial growth method. A SiO$_2$ layer 5 is then formed on the i-region 4 by a thermal oxidation method.

Figure 2B:
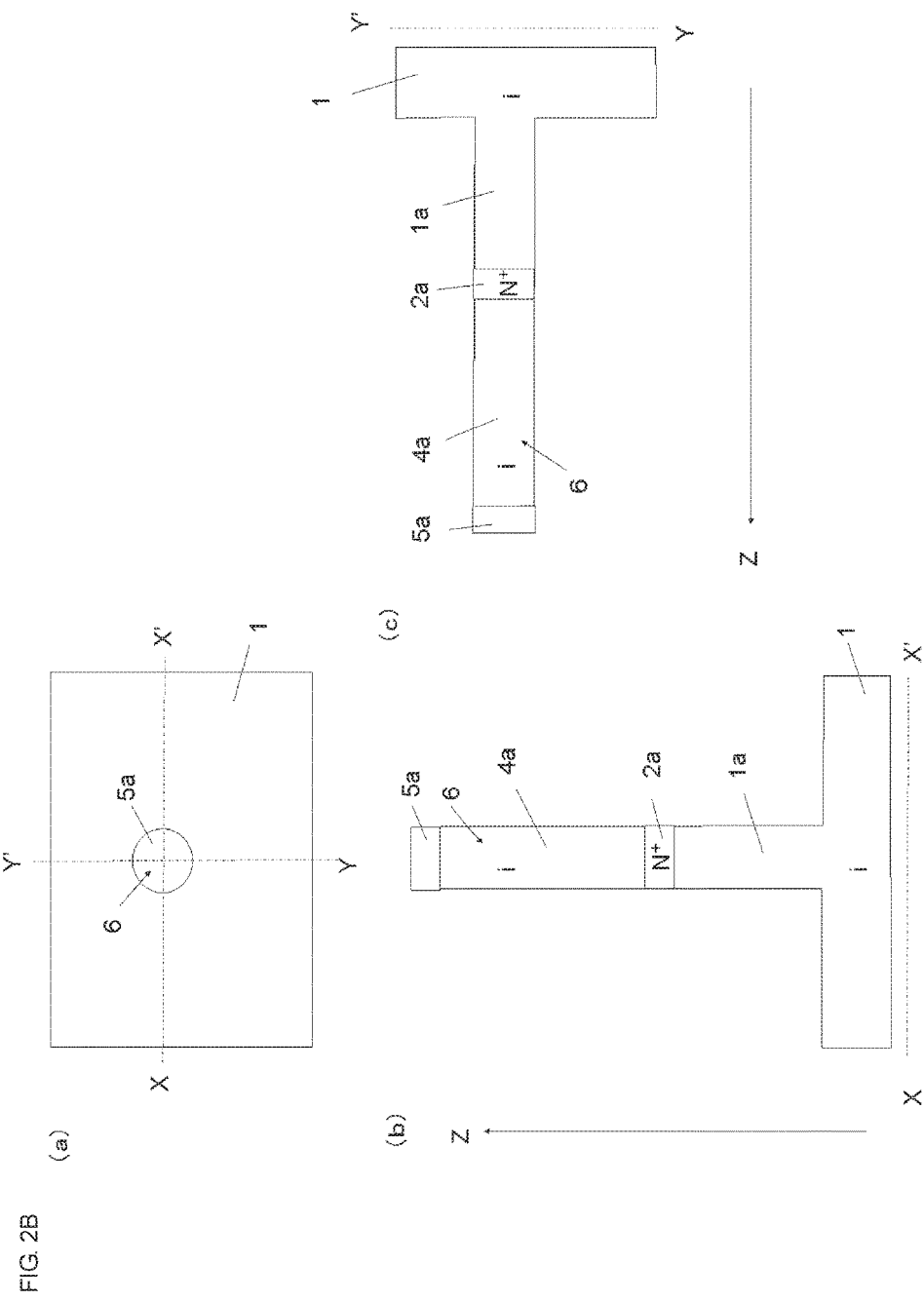
FIG. 2B includes a plan view (a) and cross-sectional views (b) and (c) of a CMOS inverter circuit illustrating the method for manufacturing an SGT-including semiconductor device according to the second embodiment of the present invention.

Next, as illustrated in FIG. 2B, the SiO$_2$ layer 5 is etched by performing a lithographic method and a reactive ion etching (RIE) method to form a SiO$_2$ layer 5a. The i-region 4, the N$^+$ region 2, and the i-layer substrate 1 are etched by a RIE method using the SiO$_2$ layer 5a as a mask so as to form a Si pillar 6 constituted by an i-region 4a, an N$^+$ region 2a, and an i-region 1a. The cross-sectional shape of the Si pillar is preferably round as illustrated in FIG. 2B(a). Then the same steps as the steps of the method for manufacturing a semiconductor device illustrated in FIGS. 10 to 1F are performed.

Figure 2C:
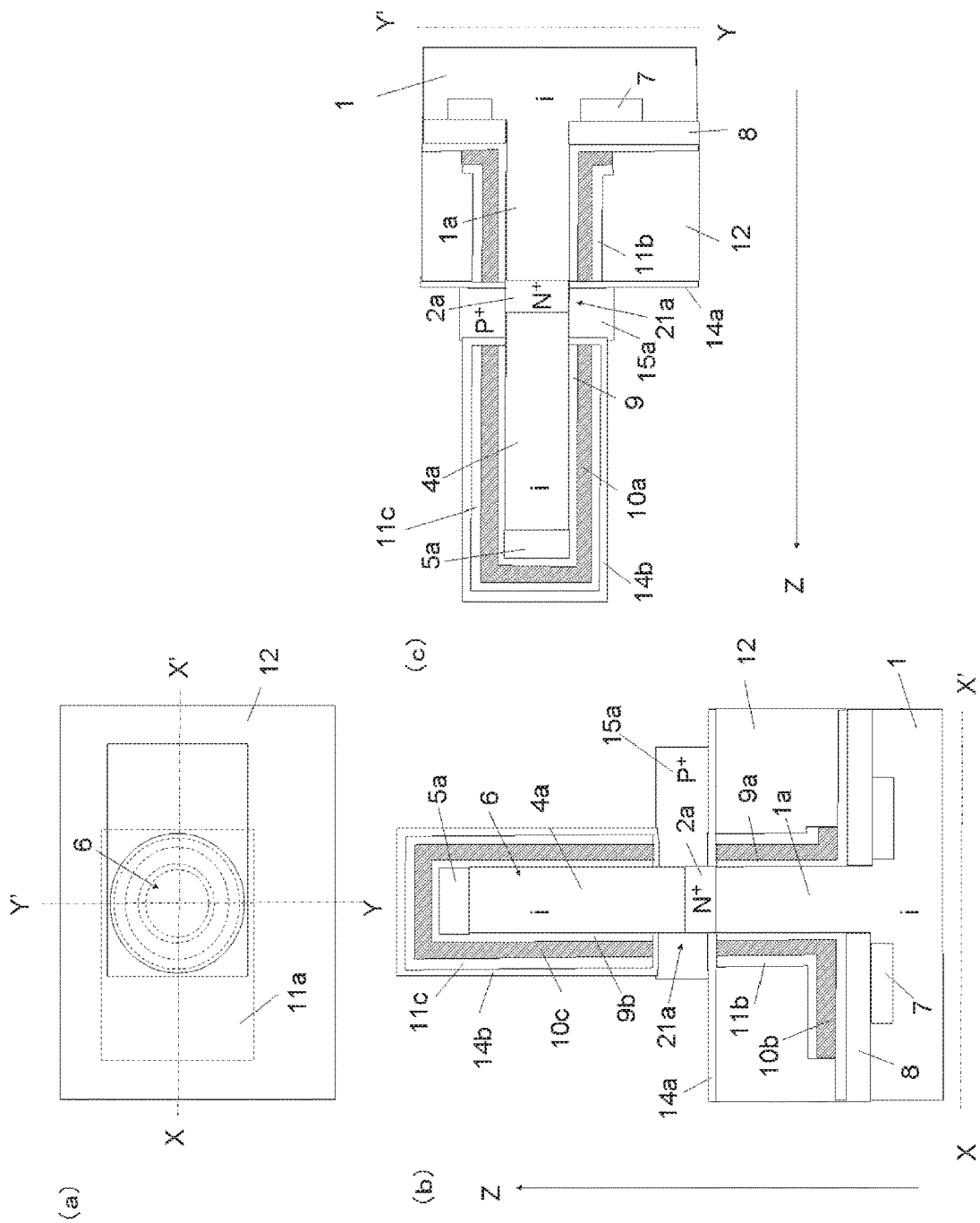
FIG. 2C includes a plan view (a) and cross-sectional views (b) and (c) of a CMOS inverter circuit illustrating the method for manufacturing an SGT-including semiconductor device according to the second embodiment of the present invention.

Then, as illustrated in FIG. 2C, a P$^+$ poly Si layer 15a is formed instead of the poly Si layer 15 in FIG. 1G. The P$^+$ poly Si layer 15a contains, for example, a large amount of boron (B) acceptor impurity.

Figure 2D:
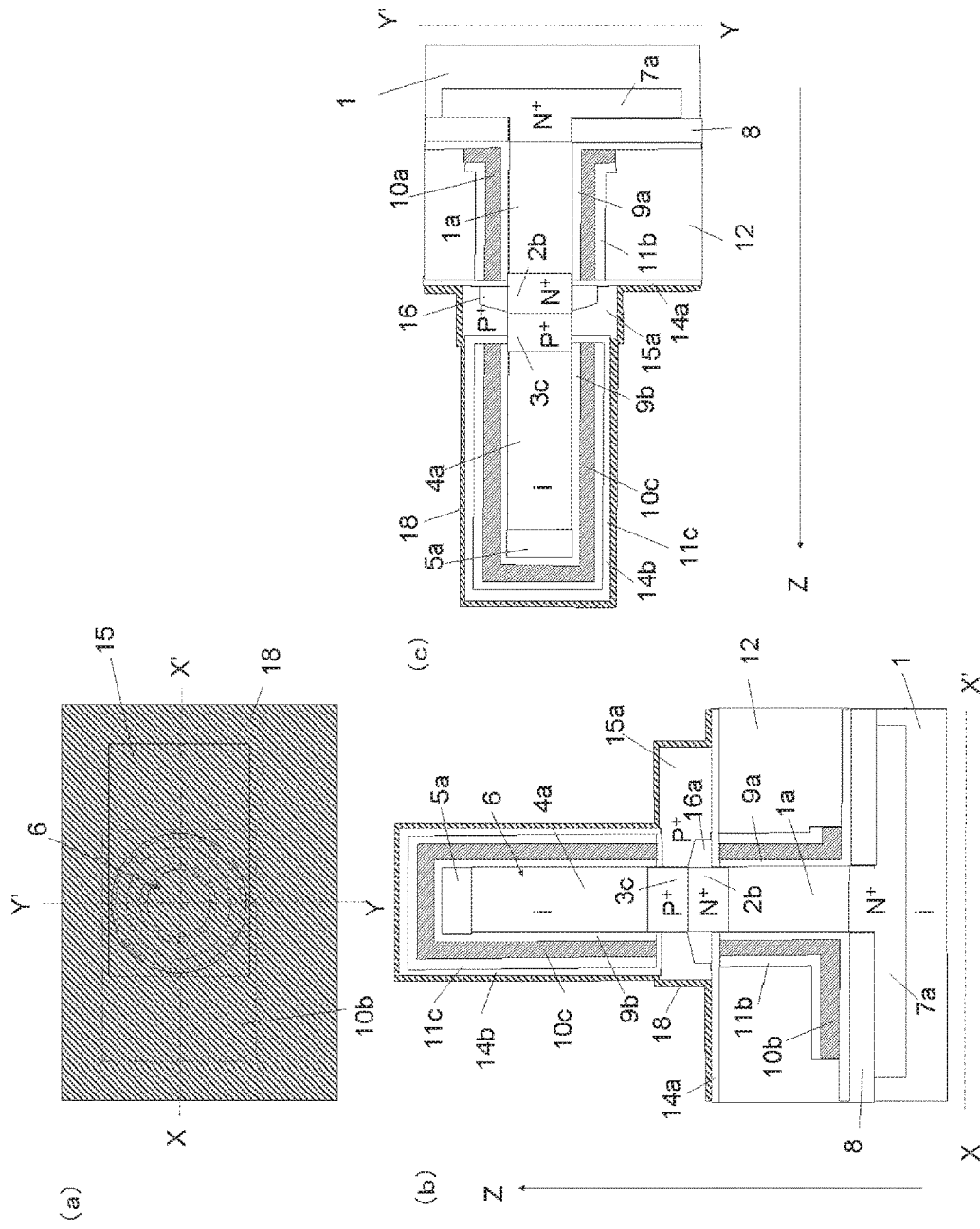
FIG. 2D includes a plan view (a) and cross-sectional views (b) and (c) of a CMOS inverter circuit illustrating the method for manufacturing an SGT-including semiconductor device according to the second embodiment of the present invention.

Next, as illustrated in FIG. 2D, a heat treatment is performed at, for example, 850° C. so as to thermally diffuse the donor impurity (As) contained in the N$^+$ region 2a into the P$^+$ poly Si layer 15a and to form an N$^+$ region 16a in the P$^+$ poly Si layer 15a. At the same time, the acceptor impurity (B) contained in the P$^+$ poly Si layer 15a is thermally diffused into the Si pillar 6 so as to form a P$^+$ region 3c in the Si pillar 6 so that the P$^+$ region 3c comes into contact with the N$^+$ region 2b. The solubility limit of As atoms in Si ($2\times10^{21}$/cm$^3$) is larger than the solubility limit of B atoms in Si ($4\times10^{20}$/cm$^3$). Thus, when As is contained in the N$^+$ region 2a and B in P$^+$ poly Si layer 15a up to their solubility limits, the shape of the portion where the N$^+$ region 16a comes into contact with the P$^+$ poly Si layer 15a is determined by the diffusion pattern of the N$^+$ region 16a having a high donor impurity concentration. Moreover, when the acceptor impurity concentration in the P$^+$ poly Si layer 15a is lower than the donor impurity concentration in the N$^+$ region 2a, the shape of the portion where the N$^+$ region 16a comes into contact with the P$^+$ poly Si layer 15a is determined by the diffusion pattern of the N$^+$ region 16a having a high donor impurity concentration. Next, a nickel (Ni) layer 18 is deposited on all parts by an ALD method. Then the same steps as those illustrated in FIGS. 11 to 1M are performed.

Figure 2E:
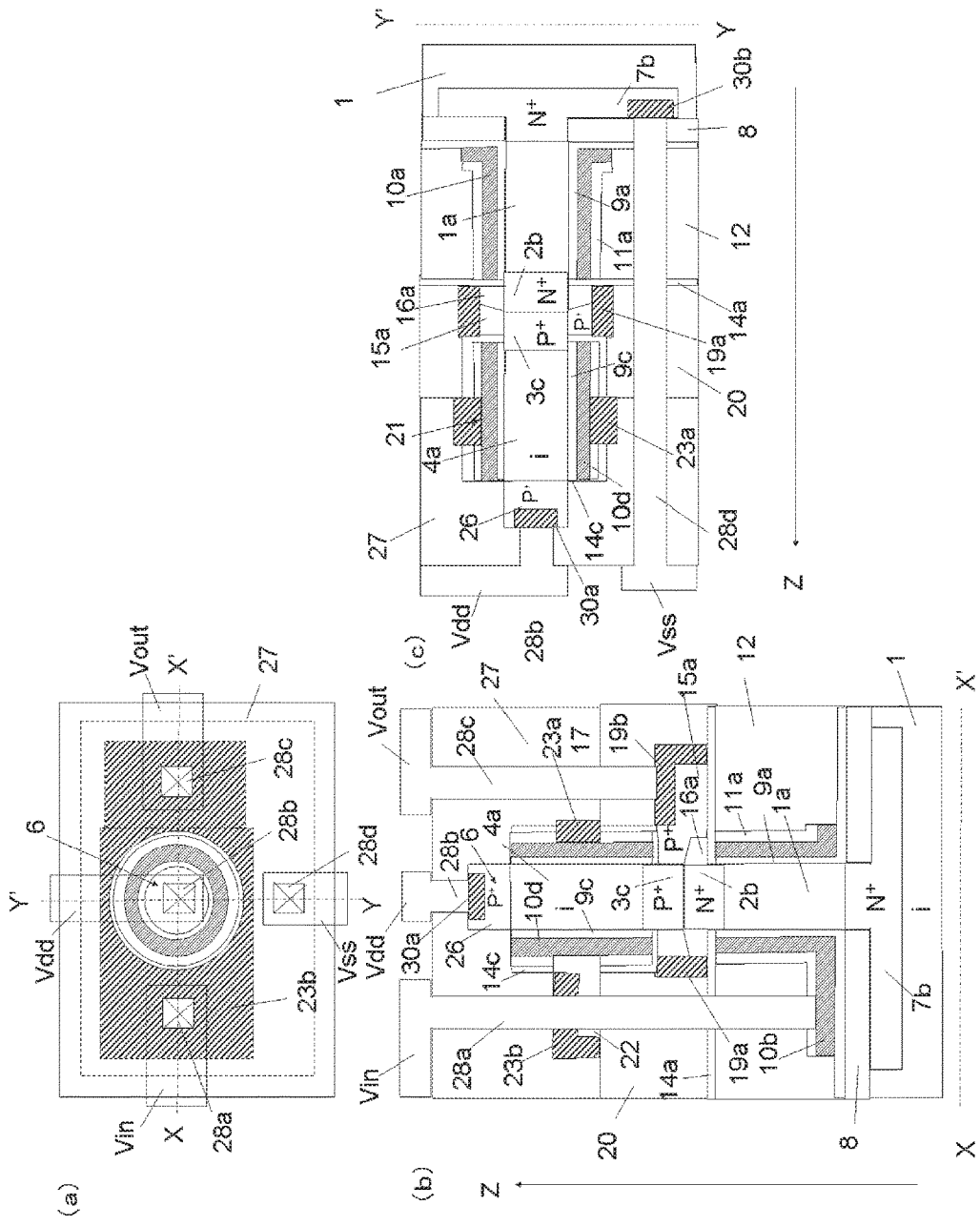
FIG. 2E includes a plan view (a) and cross-sectional views (b) and (c) of a CMOS inverter circuit illustrating the method for manufacturing an SGT-including semiconductor device according to the second embodiment of the present invention.

As a result, as illustrated in FIG. 2E, the NiSi layer 19a formed in the side surface of the P$^+$ poly Si layer 15a connects to the P$^+$ poly Si layer 15a and the N$^+$ region 16a. Then the NiSi layer 19a electrically connects to the N$^+$ region 2b and the P$^+$ region 3c in the Si pillar 6. The NiSi layer 19b formed in the upper surface layer and the side surface of the P$^+$ poly Si layer 15a is connected to the output wiring metal layer Vout through the contact hole 28c. The NiSi layers 19a and 19b are connected to each other. Accordingly, a low-resistance connection is established between the N$^+$ region 2b and the output wiring metal layer Vout and between the P$^+$ region 3c and the output wiring metal layer Vout. As a result, a CMOS inverter circuit that includes an SGT similar to the CMOS inverter circuit according to the first embodiment is obtained.

The CMOS inverter circuit of the second embodiment exhibits the following effects.

1. Whereas the P$^+$ region 3 is formed first in the step illustrated in FIG. 1A in the first embodiment, there is no need to form the P$^+$ region 3 in the second embodiment, as illustrated in FIG. 2A. The manufacturing method of the second embodiment is simpler than that of the first embodiment.

2. In the first embodiment, as illustrated in FIG. 1M(b), the P$^+$ region 17 is distanced from the NiSi layer 19b in the poly Si layer 15 on the right side of the Si pillar 6. In contrast, in the second embodiment, the P$^+$ poly Si layer 15a, which is a P$^+$ region as a whole, is electrically connected to the output wiring metal layer Vout through the NiSi layer 19b formed in the upper surface layer of the P$^+$ poly Si layer 15a and the contact hole 28c. Accordingly, according to the second embodiment, the connection resistance between the P$^+$ region 3c and the output wiring metal layer Vout can be made lower than that in the first embodiment.

In order to manufacture a circuit in which the N$^+$ region 2b and the P$^+$ region 3b are constituted by impurity regions of the same conductivity type, there is no need to form the N$^+$ region 2 in FIG. 2A. In this case, the P$^+$ poly Si layer 15a illustrated in FIG. 2C can form a particular impurity region in the Si pillar 6 by thermal diffusion from the poly Si layer containing an impurity, which is either a donor or an acceptor, into the Si pillar 6.

Third Embodiment

A CMOS inverter circuit, which is an SGT-including semiconductor device, according to a third embodiment of the present invention will now be described with reference to FIG. 3.

Figure 3:
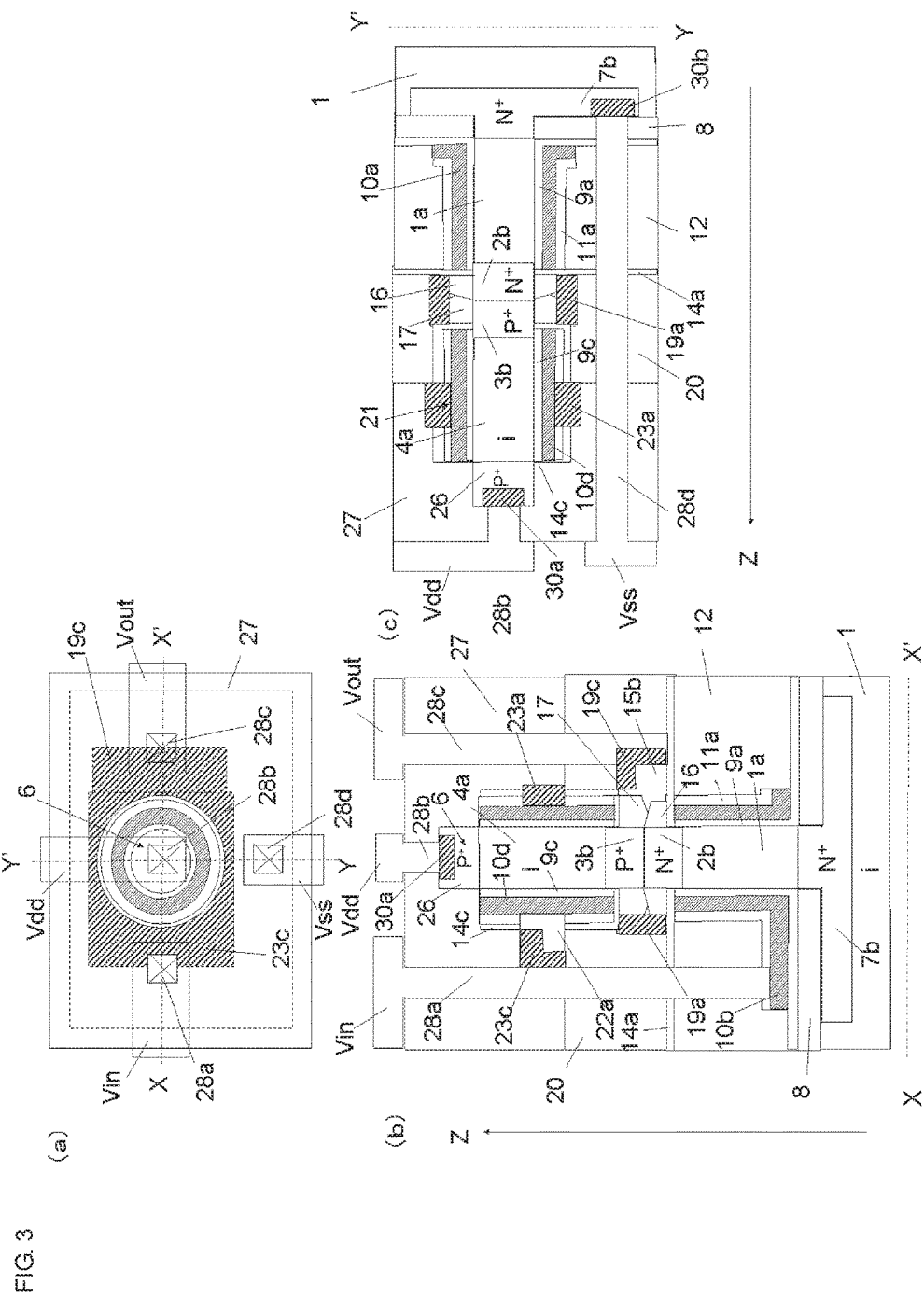
FIG. 3 includes a plan view (a) and cross-sectional views (b) and (c) of a CMOS inverter circuit illustrating a method for manufacturing an SGT-including semiconductor device according to a third embodiment of the present invention.

FIG. 3 includes a plan view and cross-sectional views of the third embodiment. The CMOS inverter circuit according to the third embodiment is obtained by the same steps as those of the first embodiment illustrated in FIGS. 1A to 1M but has the following structural differences. In the third embodiment, the contact hole 28c includes a NiSi layer 19c formed in the upper surface layer of a poly Si layer 15b and the side surface connected to the upper surface layer. The NiSi layer 19c is connected to the output wiring metal layer Vout through the contact hole 28c. The contact hole 28a penetrates a NiSi layer 23c formed on the upper surface layer and side surface of a poly Si layer 22a and is connected to the TiN layer 10b. The TiN layer 10b and the NiSi layer 23c are connected to the input wiring metal layer Vin through the contact hole 28a. The NiSi layer 23a formed in the side surface of the poly Si layer 22a is connected to the TiN layer 10d and the NiSi layers 23a and 23c are connected to each other. As a result, the input wiring metal layer Vin is electrically connected to the TiN layer 10d through the NiSi layers 23c and 23a. Here, the thickness of the poly Si layer 15b and the thickness of the poly Si layer 22a are preferably larger than ½ of a length of one side of the contact holes 28a and 28c.

The CMOS inverter circuit of the third embodiment exhibits the following effects.

1. In the first embodiment, as illustrated in FIG. 1M(a), the contact hole 28c is formed on the inner side of the outer periphery of the poly Si layer 15b. In contrast, in the third embodiment, the outer periphery of the poly Si layer 15b lies within the cross-section of the contact hole 28c in plan view. Thus, the length of the poly Si layer 15b in the X-X' direction can be decreased. Similarly, when the outer periphery of the poly Si layer 22a is arranged to lie within to cross section of the contact hole 28a in plan view, the length of the poly Si layer 22a in the X-X' direction can be decreased. As a result, the area occupied by the CMOS inverter circuit in plan view can be decreased and the degree of circuit integration can be increased.

2. Since the thickness of the poly Si layer 15b is more than ½ of the length (width) of the contact hole 28c in the X-X' direction, the contact area between the output wiring metal layer Vout and the NiSi layer 19c is increased and the contact resistance between the output wiring metal layer Vout and the NiSi layer 19c can be decreased. Similarly, since the thickness of the poly Si layer 22a is larger than ½ of the length of the contact hole 28a in the X-X' direction, the contact area between the input wiring metal layer Vin and the NiSi layer 23c can be increased and the contact resistance between the input wiring metal layer Vin and the NiSi layer 23c can be decreased. Increasing the thickness of the poly Si layers 15b and 22a will not decrease the degree of integration of the CMOS inverter circuit. Thus, the contact resistance between the output wiring metal layer Vout and the NiSi layer 19c and the contact resistance between the input wiring metal layer Vin and the NiSi layer 23c can be decreased without decreasing the degree of integration of the CMOS inverter circuit.

Fourth Embodiment

An SGT-including CMOS inverter circuit, which is a semiconductor device according to a fourth embodiment of the present invention, will now be described with reference to FIG. 4.

Figure 4:
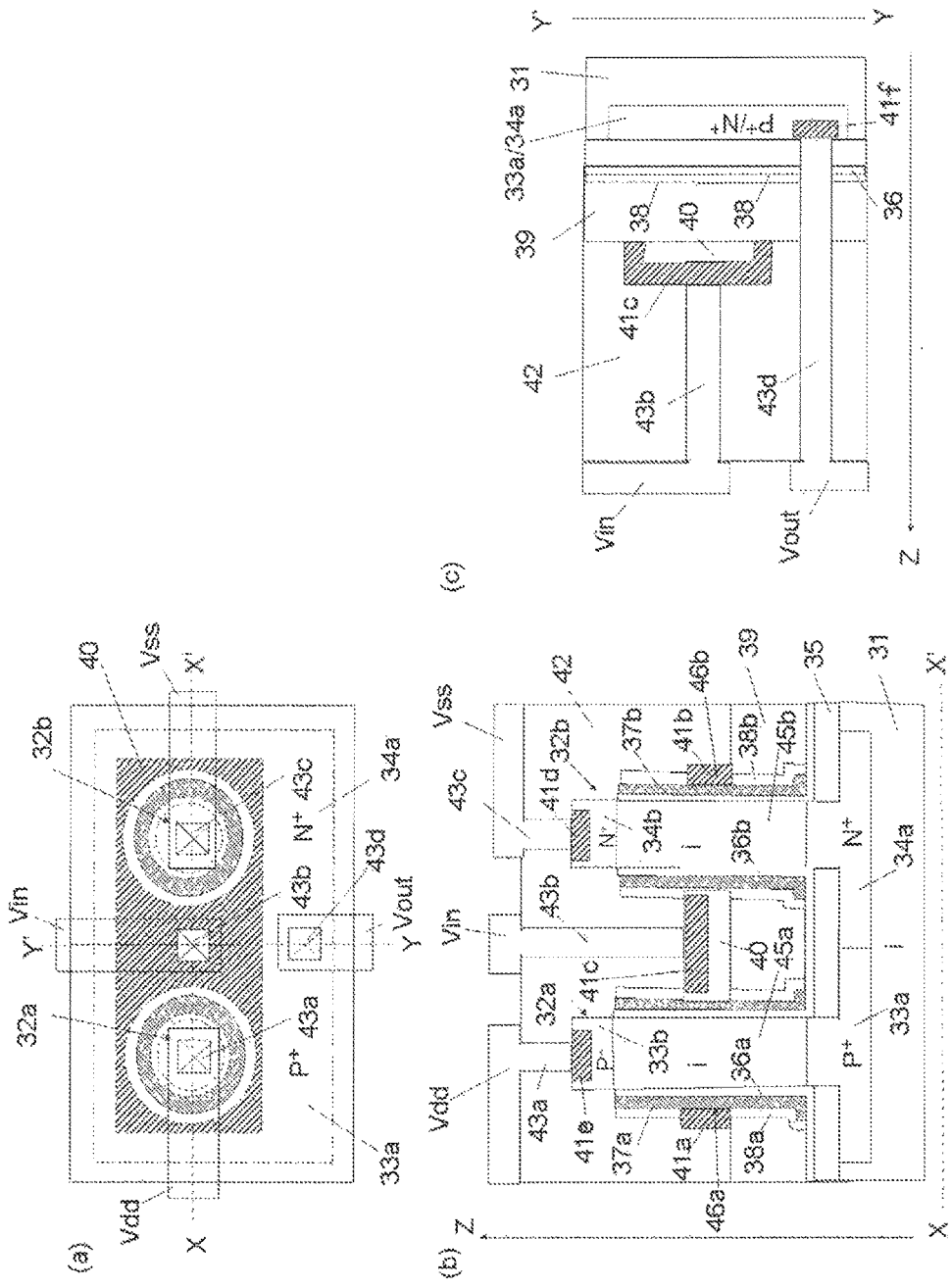
FIG. 4 includes a plan view (a) and cross-sectional views (b) and (c) of a CMOS inverter circuit illustrating a method for manufacturing an SGT-including semiconductor device according to a fourth embodiment of the present invention.

FIG. 4 includes a plan view (FIG. 4(a)), a cross-sectional view (FIG. 4(b)), and another cross-sectional view (FIG. 4(c)) of a CMOS inverter circuit in which a P-channel SGT is formed in a Si pillar 32a and an N-channel SGT is formed in a Si pillar 32b.

As illustrated in FIG. 4, the Si pillars 32a and 32b are formed on an i-layer substrate 31. A $P^+$ region 33a is formed in the bottom portion of the Si pillar 32a and the surface layer portion of the i-layer substrate 31 connected to the bottom portion and an $N^+$ region 34a is formed in the bottom portion of the Si pillar 32a and the surface layer portion of the i-layer substrate 31 connected to the bottom portion. A $SiO_2$ layer 35 is formed on the i-layer substrate 31 at the outer peripheries of the Si pillars 32a and 32b. A $P^+$ region 33b is formed in the top portion of the Si pillar 32a and an $N^+$ region 34b is formed in the top portion of the Si pillar 32b. A $H_fO_2$ layer 36a is formed so as to surround an i-region 45a between the $P^+$ regions 33a and 33b. A $H_fO_2$ layer 36b is formed so as to surround an i-region 45b between the $N^+$ regions 34a and 34b. A TiN layer 37a is formed so as to surround the $H_fO_2$ layer 36a and a TiN layer 37b is formed so as to surround the $H_fO_2$ layer 36b.

$SiO_2$ layers 38a and 38b are formed so as to surround the TiN layers 37a and 37b. By the same method as the method for forming the opening 21b in the first embodiment (refer to FIG. 1J), an opening 46a of the $SiO_2$ layer 38a is formed at the outer periphery of the TiN layer 37a and an opening 46b of the $SiO_2$ layer 38b is formed at the outer periphery of the TiN layer 37b. By the same method as the method for forming the poly Si layer 22 in the first embodiment (refer to FIG. 1j), a poly Si layer 40 connected between the Si pillars 32a and 32b and in contact with the TiN layers 37a and 37b is formed. By the same method as the method for forming the NiSi layers 19a and 19b in the first embodiment (refer to FIG. 1J), a NiSi layer 41a and a NiSi layer 41b are formed in the side surfaces of the poly Si layer 40 and a NiSi layer 41c is formed in the upper surface layer and side surfaces of the poly Si layer 40. The NiSi layer 41a is in contact with the TiN layer 37a and the NiSi layer 41b is in contact with the TiN layer 37b. The NiSi layers 41a, 41b, and 41c are connected to one another. A $SiO_2$ layer 42 is formed to cover the entirety and contact holes 43a, 43b, 43c, and 43d are formed in the $SiO_2$ layer 42. The NiSi layer 41e is formed in the upper surface layer of the $P^+$ region 33b, a NiSi layer 41d is formed in the upper surface layer of an $N^+$ region 34b, and the NiSi layer 41f is formed on the border between the $P^+$ region 33a and the $N^+$ region 34a. A power supply wiring metal layer Vdd connected to the NiSi layer 41a through the contact hole 43a, an input wiring metal layer Vin connected to the NiSi layer 41c through the contact hole 43b, a ground wiring metal layer Vss connected to the NiSi layer 43c through the contact hole 43c, and an output wiring metal layer Vout connected to the NiSi layer 41f through the contact hole 43d are formed.

As illustrated in FIG. 4, a P-channel SGT in which the $P^+$ region 33b serves as a source, the $P^+$ region 33a serves as a drain, the $H_fO_2$ layer 36a serves as a gate insulating layer, the TiN layer 37a serves as a gate conductor layer, and the i-region 45a serves as a channel is formed in the Si pillar 32a. An N-channel SGT in which the $N^+$ region 34a serves as a source, the $N^+$ region 34b serves as a drain, the $H_fO_2$ layer 36b serves as a gate insulating layer, the TiN layer 37b serves as a gate conductor layer, and the i-region 45b serves as a channel is formed in the Si pillar 32b.

In the fourth embodiment, the TiN layer 37a serving as the gate conductor layer of the P-channel SGT and the NiSi layer 41a formed in the side surface of the poly Si layer 40 are connected to each other at low resistance and the TiN layer 37b serving as the gate conductor layer of the N-channel SGT and the NiSi layer 41b formed in the side surface of the poly Si layer 40 are connected to each other at low resistance. Moreover, the NiSi layers 41a and 41b are connected to the NiSi layer 41c formed in the surface layer of the poly Si layer 40. Since the contact hole 43c is formed on the NiSi layer 41c, the input wiring metal layer Vin and the TiN layers 37a and 37b serving as the gate conductor layers of the P-channel SGT and the N-channel SGT are connected to one another at low resistance.

As discussed above, in the fourth embodiment, the poly Si layer 40 and the NiSi layer 41c formed in the surface layer of the poly Si layer 40 prevent bending and collapsing of the Si pillars 32a and 32b, serve as a region for forming the contact hole 43b connected to the input wiring metal layer Vin, and also serve as a wiring layer that electrically connects the TiN layers 37a and 37b to each other.

Fifth Embodiment

Figure 5:
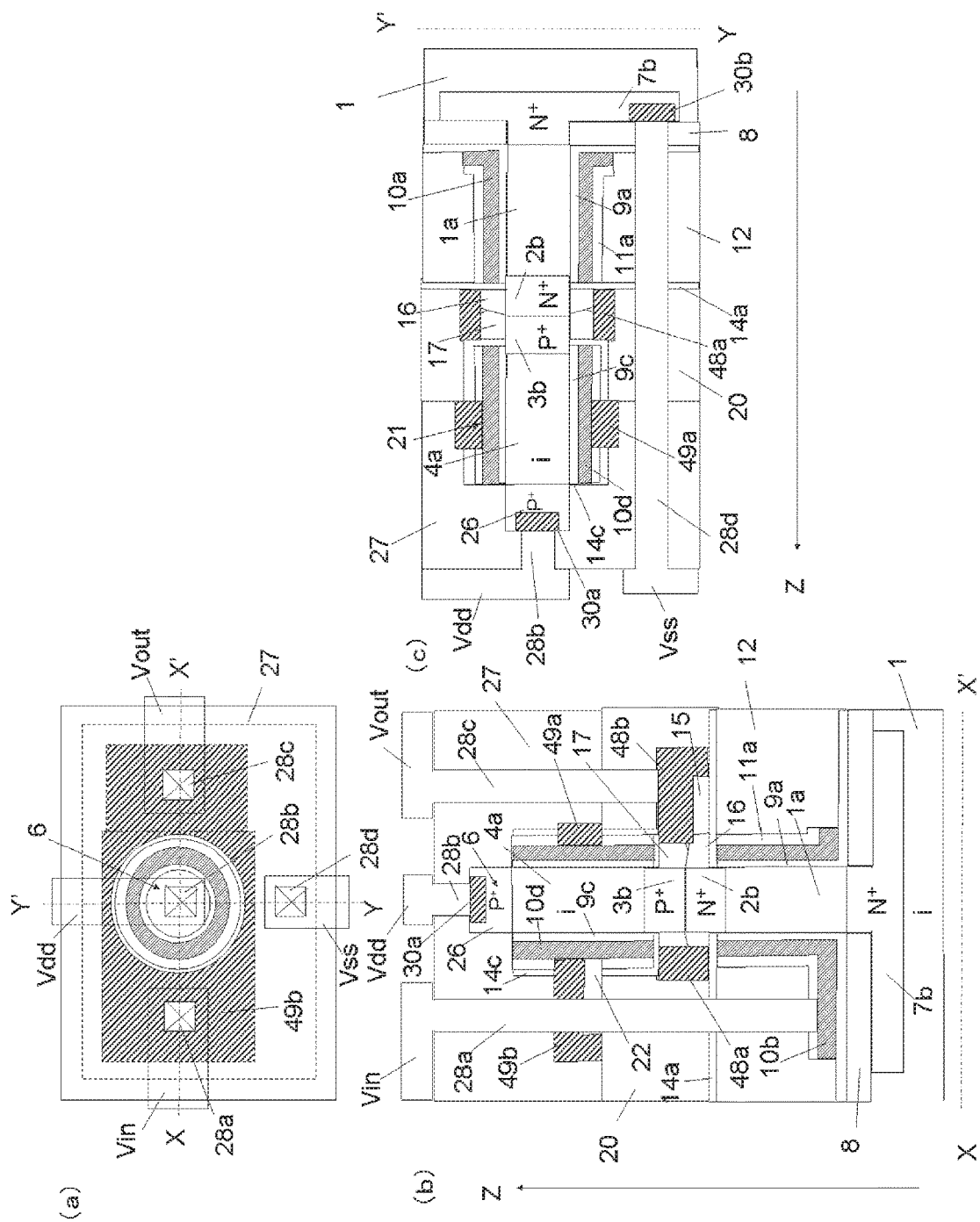
FIG. 5 includes a plan view (a) and cross-sectional views (b) and (c) of a CMOS inverter circuit illustrating a method for manufacturing an SGT-including semiconductor device according to a fifth embodiment of the present invention.

An SGT-including CMOS inverter circuit, which is a semiconductor device according to a fifth embodiment of the present invention, will now be described with reference to FIG. 5.

The steps of manufacturing the semiconductor device according to the fifth embodiment are the same as those steps illustrated in FIGS. 1A to 1M in the first embodiment but the following structural differences arise. As illustrated in FIG. 5, a NiSi layer 48a is formed in the side surface of the poly Si layer 15 and a NiSi layer 48b is formed in the upper surface layer and the side surface of the poly Si layer. The NiSi layers 48a and 48b are each in contact with the $N^+$ region 16 and the $P^+$ region 17. A NiSi layer 49a is formed in the side surface of the poly Si layer 22 and a NiSi layer 49b is formed in the upper surface layer and the side surface of the poly Si layer 22. The NiSi layers 49a and 49b are each connected to the TiN layer 10d.

Unlike in the first embodiment, in the fifth embodiment, each of the NiSi layers 48a and 48b is formed so as to contact the $N^+$ region 16 and the $P^+$ region 17 and each of the NiSi layers 49a and 49b is connected to the TiN layer 10d. As a result, the $N^+$ region 2b, the $P^+$ region 3b, and the output wiring metal layer Vout are connected to one another at low resistance and the TiN layer 10d and the input wiring metal layer Vin are connected to each other at low resistance.

Sixth Embodiment

A CMOS inverter circuit, which is an SGT-including semiconductor device according to a sixth embodiment of the present invention, will now be described with reference to FIGS. 6A and 6B.

Figure 6A:
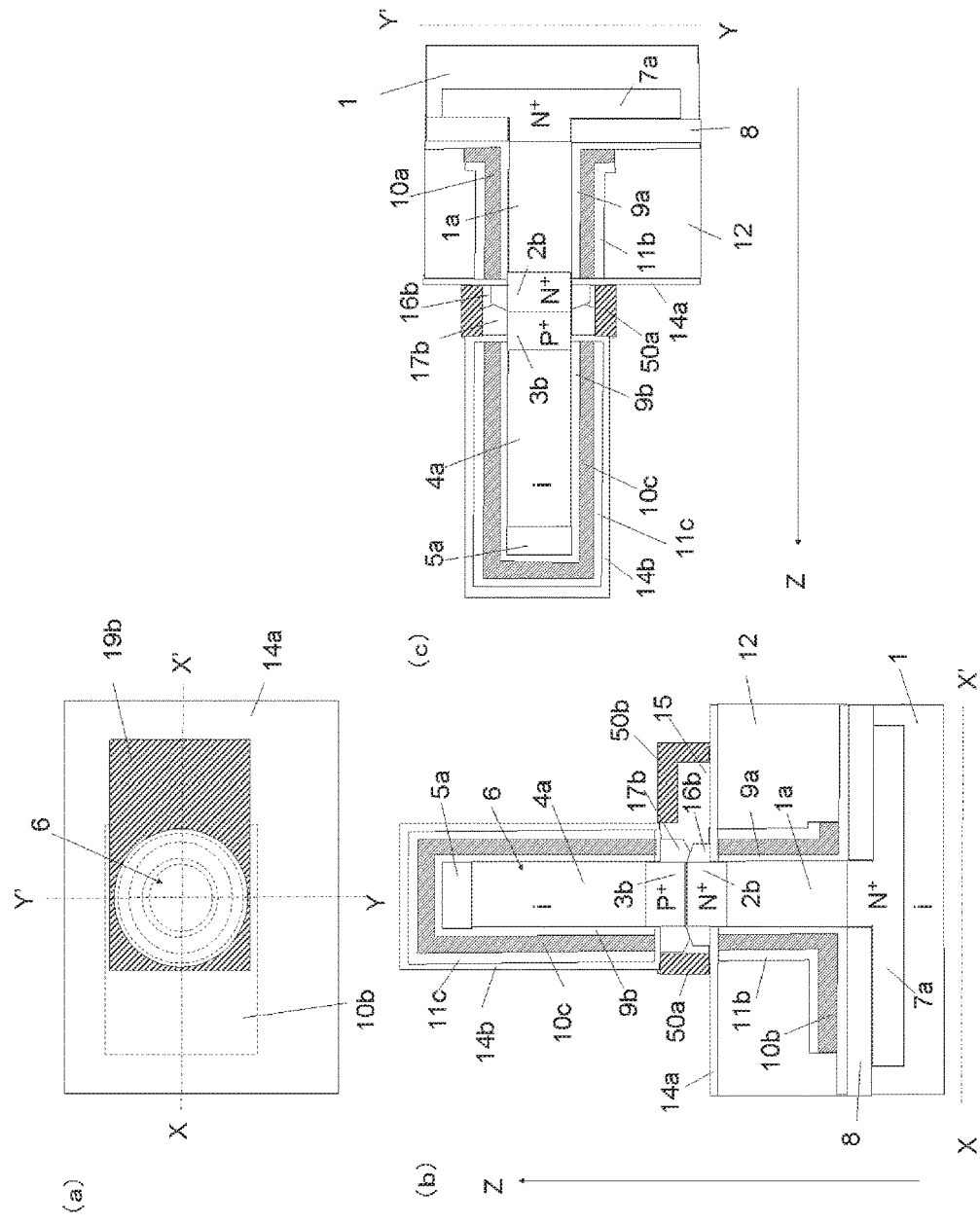
FIG. 6A includes a plan view (a) and cross-sectional views (b) and (c) of a CMOS inverter circuit illustrating a method for manufacturing an SGT-including semiconductor device according to a sixth embodiment of the present invention.

As illustrated in FIG. 6A, the same steps as those illustrated in FIGS. 1A to 11 are performed to form an $N^+$ region 16b and a $P^+$ region 17b in the poly Si layer 15 by thermal diffusion from the $N^+$ region 2b and the $P^+$ region 3b in the Si pillar 6. Then a NiSi layer 50a is formed in the side surface of the poly Si layer 15 and a NiSi layer 50b connected to the upper surface layer and the side surface of the poly Si layer 15 is formed.

Figure 6B:
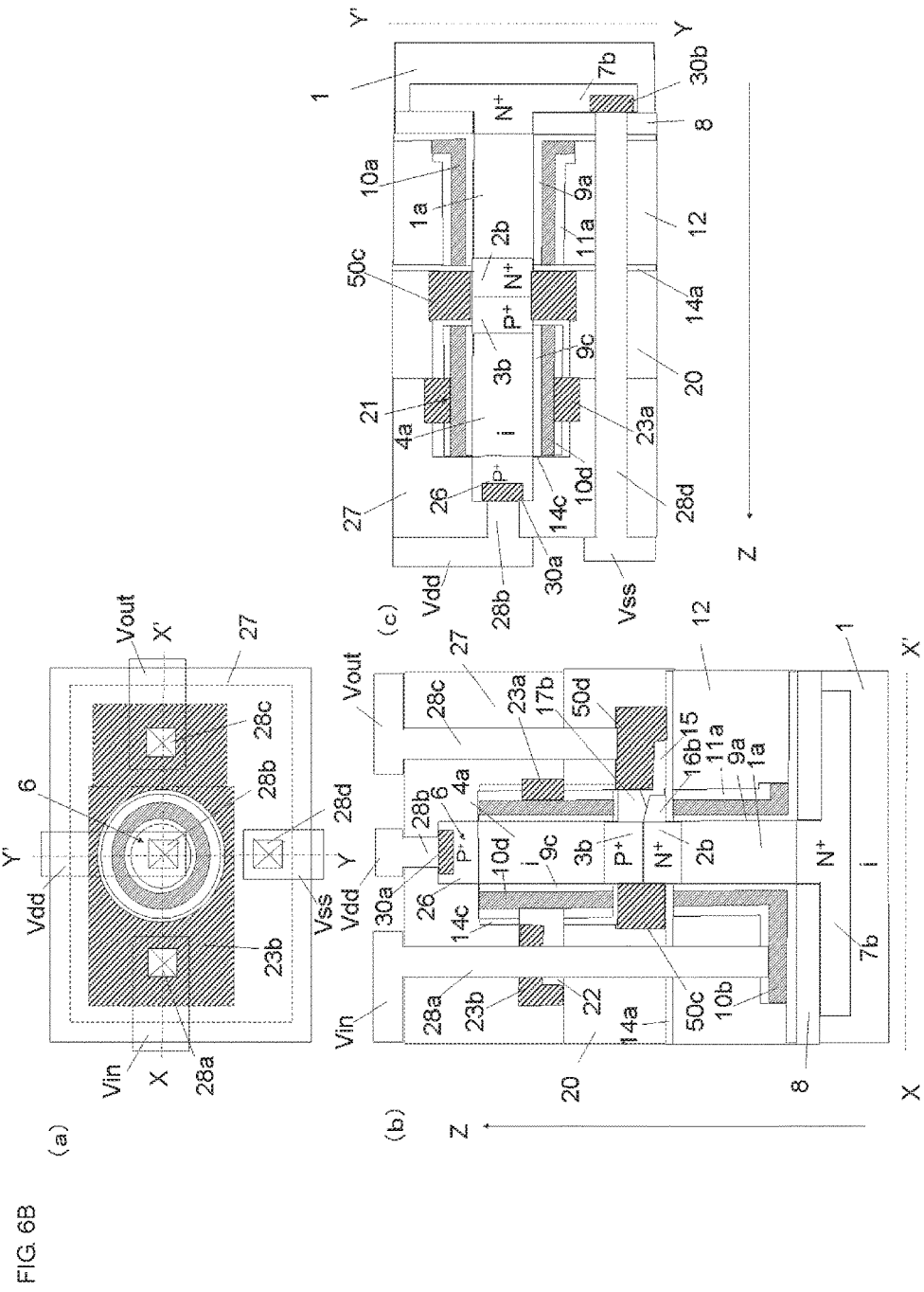
FIG. 6B includes a plan view (a) and cross-sectional views (b) and (c) of a CMOS inverter circuit illustrating the method for manufacturing an SGT-including semiconductor device according to the sixth embodiment of the present invention.

Next, as illustrated in FIG. 6B, the same steps as those illustrated in FIGS. 1J to 1M are performed to end manufacturing of a CMOS inverter circuit. At this stage, the NiSi layer 50a formed in the side surface of the poly Si layer 15 spreads to form a NiSi layer 50c and comes into contact with the $N^+$ region 2b and the $P^+$ region 3b in the Si pillar 6. The impurity contained in the NiSi layer 50b spreads into the poly Si layer 15, thereby forming a NiSi layer 50d, a contact hole 28c is formed on the upper surface of the NiSi layer 50d, and an output wiring metal layer Vout connected to the NiSi layer 50d through the contact hole 28c is formed.

Seventh Embodiment

An SGT-including semiconductor device according to a seventh embodiment of the present invention will now be described with reference to FIGS. 7A and 7B.

Figure 7A:
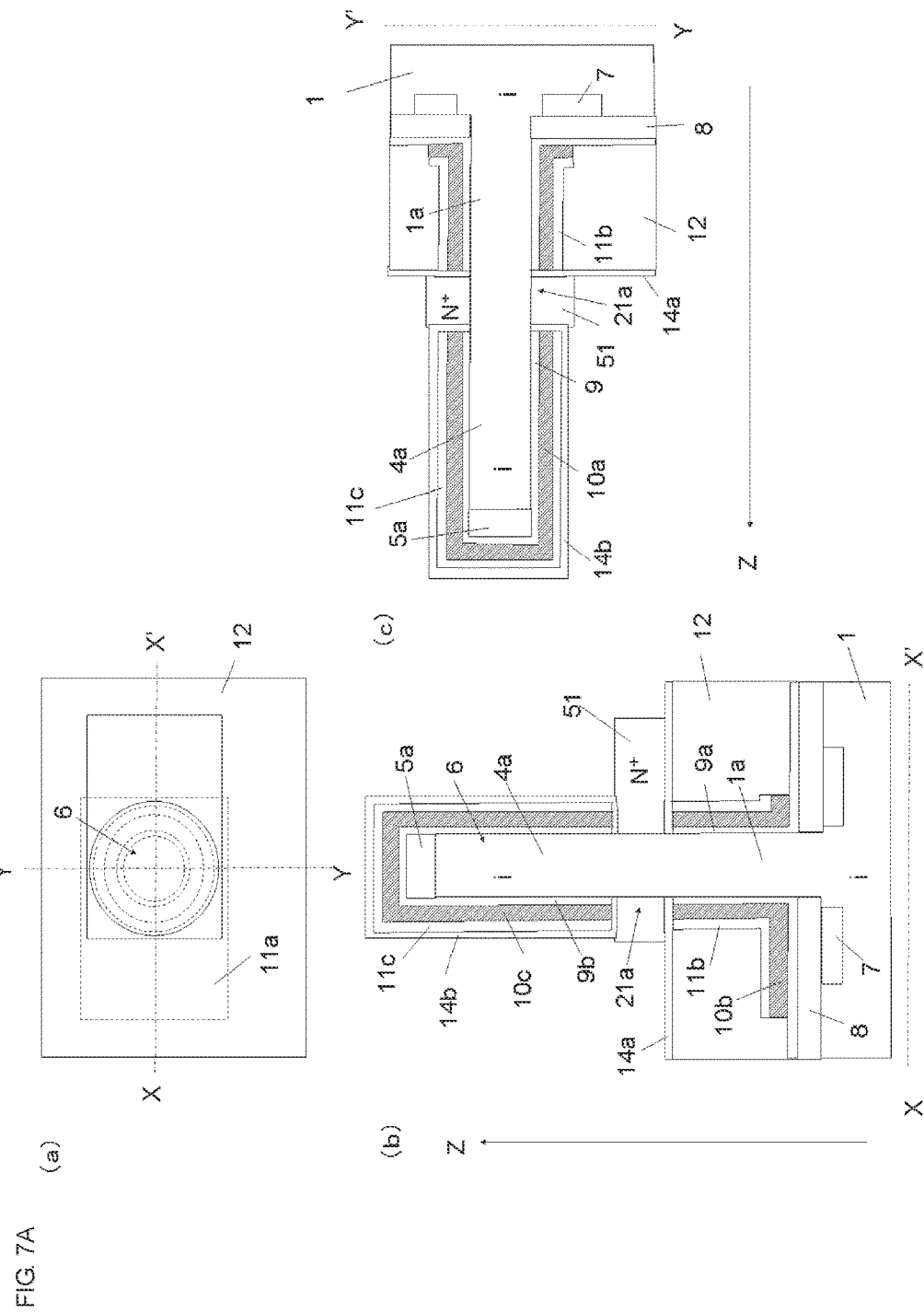
FIG. 7A includes a plan view (a) and cross-sectional views (b) and (c) of a CMOS inverter circuit illustrating a method for manufacturing an SGT-including semiconductor device according to a seventh embodiment of the present invention.
Figure 7B:
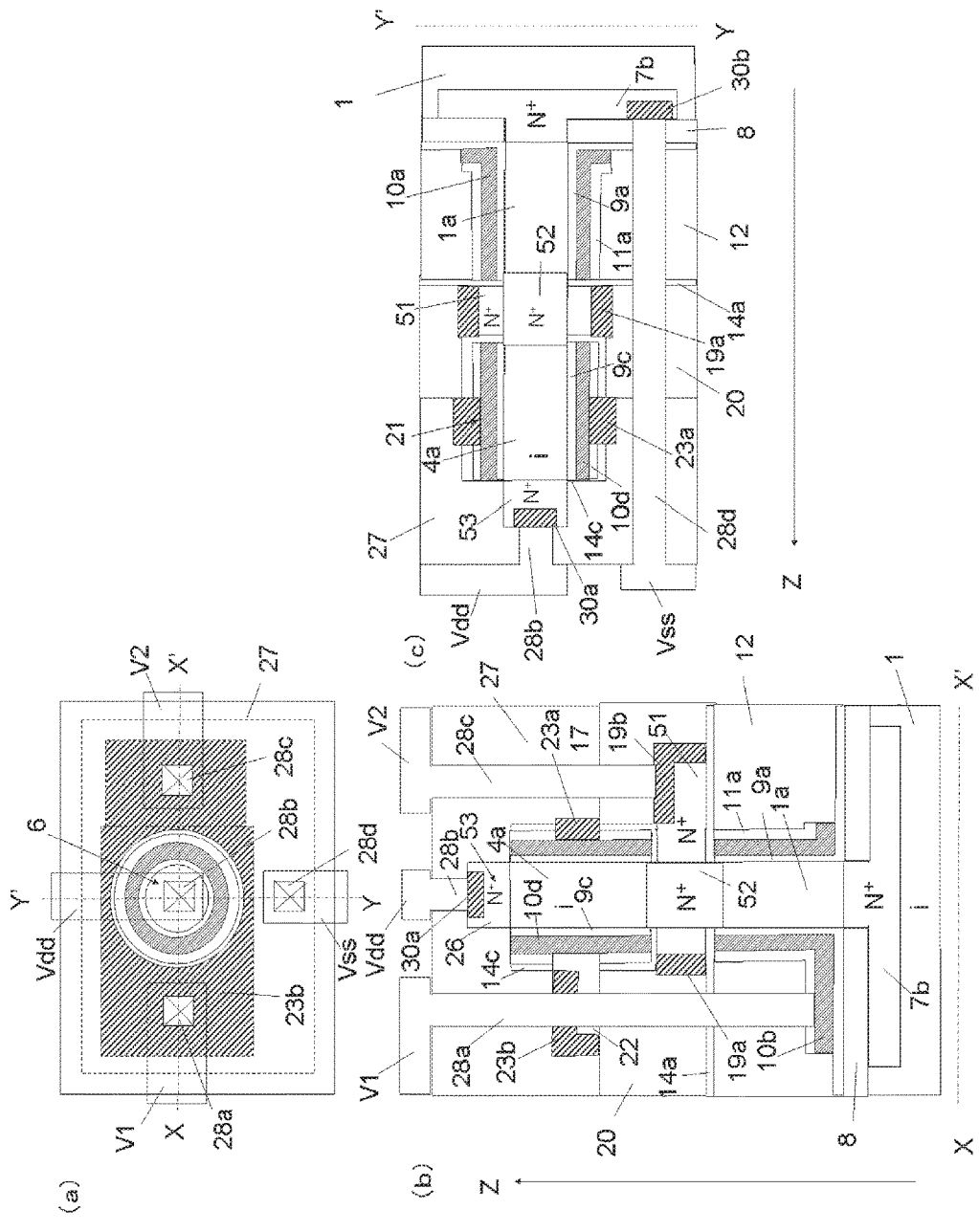
FIG. 7B includes a plan view (a) and cross-sectional views (b) and (c) of a CMOS inverter circuit illustrating the method for manufacturing an SGT-including semiconductor device according to the seventh embodiment of the present invention.
Figure 8:
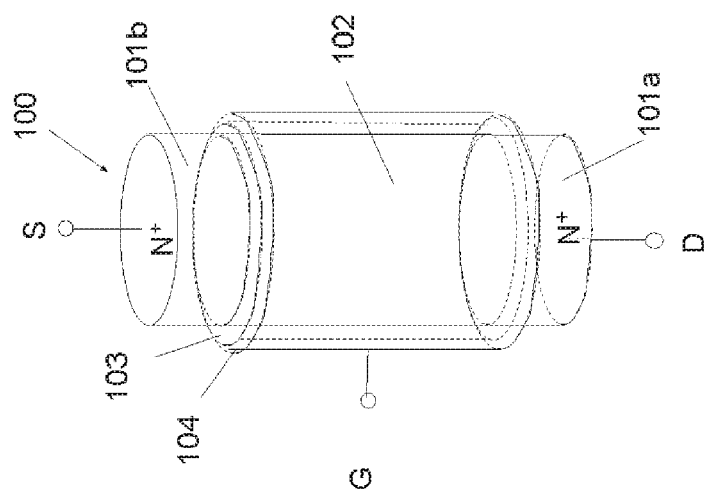
FIG. 8 is a schematic diagram of an SGT of related art.
Figure 9:
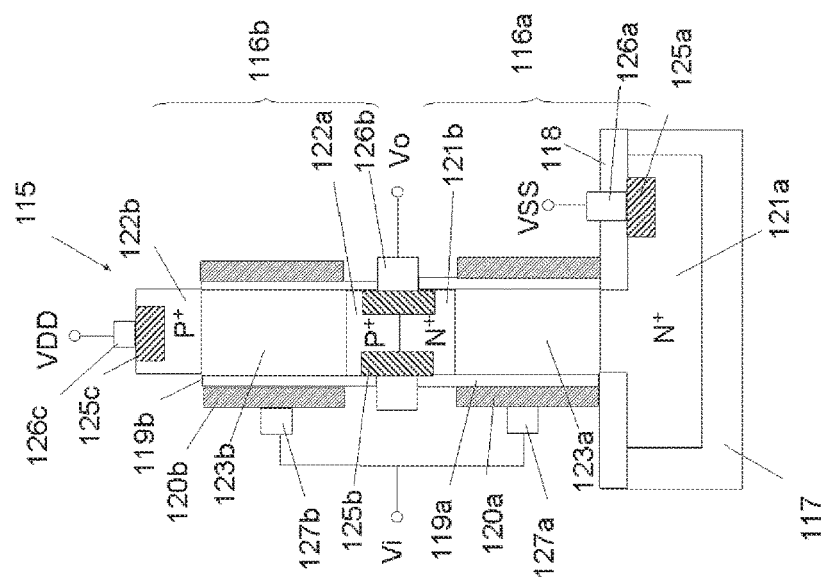
FIG. 9 is a schematic diagram of a CMOS inverter circuit of related art, in which an N-channel SGT is formed in a lower portion of a single Si pillar and a P-channel SGT is formed in an upper portion of the single Si pillar.

In FIG. 7A, the $N^+$ region 2a illustrated in FIG. 2C is not formed in the Si pillar 6. Instead of the $P^+$ poly Si layer 15a, an $N^+$ poly Si layer 51 is formed.

A semiconductor device of this embodiment is obtained from the structure illustrated in FIG. 7A by the following method. That is, as illustrated in FIG. 7B, an $N^+$ region 52 is formed in the Si pillar 6 by thermal diffusion of the donor impurity from the $N^+$ poly Si layer 51. An $N^+$ region 53 is formed in the top portion of the Si pillar 6. Then the contact hole 28c is formed on the NiSi layer 19b formed in the side surface and the upper portion of the $N^+$ poly Si layer 51. A wiring metal layer V2 is formed on the $SiO_2$ layer 27 so as to connect to the contact hole 28c. A wiring metal layer V1 electrically connected to the NiSi layer 23b, the poly Si layer 22, and the TiN layer 10d through the contact hole 28a is formed on the $SiO_2$ layer 27. As a result, an N-channel SGT connected to the $N^+$ region 52 is formed above the $N^+$ region 52 and another N-channel SGT connected to the $N^+$ region 52 is formed below the $N^+$ region 52. The gate TiN layers 10b and 10d of the two SGTs are electrically connected to the wiring metal layer V1 through the contact hole 28a. The $N^+$ region 52 is electrically connected to a wiring metal layer V2 through the $N^+$ poly Si layer 51, the NiSi layer 19b, and the contact hole 28c.

The seventh embodiment exhibits the following effects.

1. The $N^+$ regions corresponding to the $N^+$ region 2 and the $P^+$ region 3 illustrated in FIG. 1A in the first embodiment can be formed by thermal diffusion from the $N^+$ poly Si layer 51 in the seventh embodiment. Thus, the manufacturing process can be simplified.

2. In the first embodiment, as illustrated in FIG. 1F, the opening 21a formed at the side surface of the Si pillar 6 needs to be aligned with the $N^+$ region 2a and the $P^+$ region 3a. Since the $N^+$ region 52 is formed by thermal diffusion from the $N^+$ poly Si layer 51 after formation of the opening 21a in the seventh embodiment, there is no need to align the opening 21a and the $N^+$ region 52 and thus the manufacturing process can be simplified.

In FIG. 1M of the first embodiment, the NiSi layer 19a formed in the side surface of the poly Si layer 15 is electrically connected to the $N^+$ region 2b and the $P^+$ region 3b through the $N^+$ region 16 and the $P^+$ region 17. In contrast, in the sixth embodiment, the $N^+$ region 16b and the $P^+$ region 17b are located between the NiSi layer 50a and the $N^+$ region 2b and between the NiSi layer 50a and the $P^+$ region 3b in the step illustrated in FIG. 6A; however, at the final stage of the manufacturing process, the NiSi layer 50c comes into direct contact with the $N^+$ region 2b and the $P^+$ region 3b. In such a case, the donor and acceptor impurities in the $N^+$ region 16b and the $P^+$ region 17b in the poly Si layer 15 return to the interior of the Si pillar 6 by the impurity sweeping effect of the NiSi layer 50a.

In the fifth embodiment also, the NiSi layers 50a and 50b are formed in the poly Si layer 15 formed at the outer peripheries of the $N^+$ region 2a and the $P^+$ region 3a. Thus, bending and collapsing of the Si pillar 6 can be prevented. For example, in the case of forming a circuit that includes, on the same semiconductor substrate, a single-layer gate structure SGT having TiN layers 10b and 10d as illustrated in FIG. 6B and a nonvolatile memory SGT having a double-layer gate structure constituted by a floating gate and a control gate, the first embodiment can be applied to the single-layer gate structure SGT and the fifth embodiment can be applied to the double-layer gate structure SGT. In this manner, the electrical connections between impurity regions formed in the central portion of the Si pillar 6 and the wiring metal layers (output wiring metal layer Vout, input wiring metal layer Vin, etc.) formed in the circuit can be more reliably established. The technical idea of the present invention can also be applied to formation of a circuit that includes a nonvolatile memory SGT that uses a SiN layer as a charge storage layer instead of the floating gate. This applies to other embodiments of the present invention also.

In the embodiments described above, examples in which Si (silicon) pillars are used as the semiconductor pillars are described. However, this is not limiting. The technical idea of the present invention can also be applied to semiconductor devices with SGTs in which semiconductor pillars are composed of semiconductor materials other than silicon.

In the embodiments described above, a method for manufacturing a semiconductor device in which one or two SGTs are formed in one Si pillar is described. However, this is not limiting. The technical idea of the present invention can also be applied to a method for manufacturing a semiconductor device having three or more SGTs in one semiconductor pillar.

In the first embodiment, a semiconductor device in which an N-channel SGT is formed in the lower portion of the Si pillar 6 and a P-channel SGT is formed in the upper portion of the Si pillar 6 is described. However, the technical idea of the present invention can also be applied to a semiconductor device in which a P-channel SGT is formed in the lower portion of the Si pillar 6 and an N-channel SGT is formed in the upper portion of the Si pillar 6. This applies to other embodiments of the present invention also.

The poly Si layer 15 of the first embodiment may be any material layer in which the N$^+$ region 16 and the P$^+$ region 17 are formed by thermal diffusion of the N$^+$ region 2a and the P$^+$ region 3a in the Si pillar 6 into the poly Si layer 15. For example, the poly Si layer 15 may be a SiGe material layer or other material layer. This applies to other embodiments of the present invention also.

The poly Si layers 15 and 22 in the first embodiment may each be a single-crystal layer formed by an ALD method, a material layer close to a single crystal, or an amorphous layer, for example. This applies to other embodiments of the present invention also.

In the first embodiment, the case in which the donor impurity and the acceptor impurity are contained in the N$^+$ region 2a and the P$^+$ region 3a up to their solubility limits in silicon is described. However, the solubility limits in silicon need not be reached and the donor impurity concentration and the acceptor impurity concentration in the N$^+$ region 2a and the P$^+$ region 3a may be any impurity concentration that can realize the state in which the N$^+$ region 2b is connected to the NiSi layer 19a through the N$^+$ region 16 and the P$^+$ region 3b is connected to the NiSi layer 19a through the P$^+$ region 17. This applies to other embodiments of the present invention also.

In the first embodiment, the NiSi layers 19a and 19b are all formed within the poly Si layer 15. Alternatively, a portion of the NiSi layer 19a and a portion of the NiSi layer 19b may reach the Si pillar 6 through crystal grain boundaries between small single crystals of the poly Si layer 15 so that the NiSi layers 19a and 19 partly penetrate the Si pillar 6. The effects of the present invention are still obtained in this case. Moreover, according to the present invention, even when the NiSi layers 19a and 19b partly penetrate the Si pillar 6, the poly Si layer 15 surrounding the outer peripheries of the N$^+$ region 2a and the P$^+$ region 3b serve as material layers that prevent bending and collapsing of the Si pillar 6. Thus, bending and collapsing of the Si pillar 6 are prevented. This applies to other embodiments of the present invention also.

In the first embodiment, at least the NiSi layer 19a formed in the side surface of the poly Si layer 15 needs to be in contact with the N$^+$ region 16 and the P$^+$ region 17. Thus, as illustrated in FIG. 1M(b), the NiSi layer 19b need not be in contact the N$^+$ region 16 and the P$^+$ region 17 but may make contact with the N$^+$ region 16 and the P$^+$ region 17. This applies to other embodiments of the present invention also.

The NiSi layers 19a, 19b, 23a, and 23b in the first embodiment may be other alloy layers as long as they can connect to the poly Si layer 15, the poly Si layer 22, the input wiring metal layer Vin, and the output wiring metal layer Vout at low resistance. For example, tantalum silicide (TaSi), tungsten silicide (WSi), titanium silicon (TiSi), cobalt silicon (CoSi), or the like may be used. This applies to other embodiments of the present invention also.

In the second embodiment, the N$^+$ region 2b is formed in the Si pillar 6 and the P$^+$ region 3c is formed by thermal diffusion of the donor impurity in the N$^+$ region 2b into the P$^+$ poly Si layer 15a. However, this is not limiting. Alternatively, a P$^+$ region 3c may be formed in the Si pillar 6, an N+ poly Si layer having a lower donor impurity concentration than the P$^+$ region 3c may be formed instead of the P$^+$ poly Si layer 15a, and the acceptor impurity of the P$^+$ poly Si layer 15a may be thermally diffused into the N$^+$ poly Si layer.

In the second embodiment, the N-channel SGT is formed in the lower portion of the Si pillar 6 and the P-channel SGT is formed in the upper portion of the Si pillar 6. In the case where a P-channel SGT is formed in the lower portion of the Si pillar 6 and an N-channel SGT is formed in the upper portion of the Si pillar 6, all needed is to change the conductivity type of each of the N$^+$ regions 2b and 7b, the P$^+$ regions 3c and 26, and the P$^+$ poly Si layer 15a to a different conductivity type. Thus, the technical idea of the present invention can be applied.

In the second embodiment, the case in which the P$^+$ region 3c is formed on the N$^+$ region 2b is described. This vertical positional arrangement may be reversed; in other words, the technical idea of the present invention can be applied to the case in which an N$^+$ region is formed on a P$^+$ region.

In the second embodiment, the case in which the N$^+$ region 2b and the P$^+$ region 3c are formed in the Si pillar 6 is described. When these two regions have the same conductivity type, there is no need to form the N$^+$ region 2 in FIG. 2A.

In the first embodiment, the case in which the technical idea of the present invention is applied to the electrical connection between the N$^+$ region 2b and the output wiring metal layer Vout and the P$^+$ region 3b and the output wiring metal layer Vout and the electrical connection between the TiN layer 10d serving as a gate conductor layer and the input wiring metal layer Vin. Alternatively, the technical idea of the present invention can be applied to only one of these. The same applies to other embodiments of the present invention.

In the seventh embodiment, two N-channel SGTs are formed in the upper and lower portions of the Si pillar 6, respectively. The technical idea of the present invention can also be applied to the case in which two P-channel SGTs are formed in the upper and lower portions of the Si pillar 6 respectively by using a P$^+$ poly Si layer instead of the N$^+$ poly Si layer 51.

The P$^+$ regions 26 and 33b and the N$^+$ region 34b formed in the top portions of the Si pillars 6, 32a, and 32b may be metal layers that form Schottky diodes with the i-regions 4a, 45a, and 45b. In this case, the NiSi layers 30a, 41c, and 41d are not needed.

In the first to third embodiments, the cases in which the technical idea of the present invention is applied to CMOS inverter circuits are described. The technical idea of the present invention can also be applied to other semiconductor devices such as circuits, apparatuses, and elements.

As illustrated by each embodiment, an SGT has a structure in which a HfO$_2$ layer (gate insulating layer) 9c is formed at the outer periphery of a semiconductor pillar such as a Si pillar 6 and a TiN layer (gate conductor layer) 10d is formed at the outer periphery of the HfO$_2$ layer 9c. A flash memory element which has a charge storing layer or a conductor layer electrically floating between the HfO$_2$ layer 9c and the TiN layer 10d is also a type of SGTs and thus the technical idea of the present invention can be applied to a method for manufacturing a flash memory element. For example, the technical idea of the present invention can be applied to a NAND flash memory element having plural gate conductor layers that are isolated from each other, the gate conductor layers being formed in one semiconductor pillar.

In the first embodiment, an N-channel SGT is formed in the lower portion of the Si pillar 6 and a P-channel SGT is formed in the upper portion of the Si pillar 6. It is possible to apply the technical idea of the present invention to a circuit in which a P-channel SGT is formed in the lower portion and an N-channel SGT is formed in the upper portion. The technical idea of the present invention can also be applied to formation of a circuit in which both SGTs in upper and lower portions are N-channel or P-channel. This applies to other embodiments of the present invention also.

In the embodiments described above, examples in which only SGTs are formed in semiconductor pillars (Si pillar 6) are described but this is not limiting. The technical idea of the present invention can also be applied to a method for manufacturing a semiconductor device in which an SGT and other elements (for example, a photodiode) are mounted.

In the first embodiment, an example in which the TiN layers 10b and 10d serve as gate conductor layers is described but this is not limiting. The gate conductor layers may be composed of other metal materials. Alternatively, the gate conductor layer may have a multilayered structure constituted by a metal layer and a poly Si layer, for example. This structure can also be applied to other embodiments of the present invention.

FIG. 1E of the first embodiment illustrates the case in which the SiN layer 12, which has a low etching rate for HF ions, is formed below the resist layer 13 but this is not limiting. The SiN layer 12 may be composed of any other material with a low etching rate for HF ions. This applies to the SiN layer 20 also. This structure can also be applied to other embodiments of the present invention.

In the embodiments described above, a SOI substrate can be used instead of the i-layer substrate 1.

FIGS. 2A to 2E of the first embodiment illustrate the cases in which the i-layer substrate 1 and other layers are composed of Si but this is not limiting. The technical idea of the present invention is applicable to the cases in which other semiconductor material layers are used. This structure applies to other embodiments of the present invention also.

In the first embodiment, the N$^+$ region 2b and the P$^+$ region 3b are in contact with each other. However, the technical idea of the present invention can be applied to the case in which an insulating layer is formed between the N$^+$ region 2b and the P$^+$ region 3b. This structure applies to other embodiments of the present invention also.

The resist layer 13 of the first embodiment need not be a resist material layer used in optical, X-ray, or electron beam lithography as long as it is a material layer from which a shape desired for the opening can be obtained. This also applies to other embodiments of the present invention.

The present invention allows various other embodiments and modifications without departing from the spirit and scope of the present invention in a broad sense. The embodiments described above merely illustrate examples of the present invention and do not limit the scope of the present invention. The embodiments and modifications can be freely combined. Some feature of the embodiment described above may be omitted as needed and such an embodiment is still within the technical scope of the present invention.

INDUSTRIAL APPLICABILITY

According to an SGT-including semiconductor device and a manufacturing method therefor according to the present invention, a highly integrated semiconductor device can be obtained.

The following is a summary list of reference numerals and the corresponding structure used in the above description of the invention:

| | |
|---|---|
| 1, 31 | i-layer substrate |
| 2, 2a, 7, 16, 16a, 34a, 34b, 52, 53 | N$^+$ region |
| 3, 3a, 3b, 3c, 17, 26, 33a, 33b | P$^+$ region |
| 4, 4a, 1a, 45a, 45b | i-region |
| 5, 5a, 8, 11, 11a, 11b, 11c, 11d, 14a, 14b, 14c, 25, 38a, 38b, 42 | SiO$_2$ layer |
| 6, 32a, 32b | Si pillar |
| 9, 9a, 9b, 9c, 36a, 36b | HfO$_2$ layer |
| 10, 10a, 10b, 10c, 10d, 37a, 37b | TiN layer |
| 12, 20, 39 | SiN layer |
| 13 | resist layer |
| 21a, 21b | opening |
| 15, 40 | poly Si layer |
| 15a | P$^+$ poly Si layer |
| 51 | N$^+$ poly Si layer |
| 18 | Ni layer |
| 19a, 19b, 19c, 23a, 23b, 23c, 30a, 30b, 41a, 41b, 41c, 41d, 50a, 50b, 50c, 50d | NiSi layer |
| 28a, 28b, 28c, 28d, 43a, 43b, 43c, 43d | contact hole |
| Vin | input wiring metal layer |
| Vdd | power supply wiring metal layer |
| Vout | output wiring metal layer |
| Vss | ground wiring metal layer |
| V1, V2 | wiring metal layer |

The invention claimed is:

1. A method for manufacturing an SGT-including semiconductor device, the method comprising:
    a first semiconductor pillar forming step of forming a first semiconductor pillar vertically on a substrate;
    a first impurity region forming step of forming a first impurity region in a lower portion of the first semiconductor pillar, the first impurity region containing a donor or acceptor impurity;
    a second impurity region forming step of forming a second impurity region in the first semiconductor pillar at a position above and remote from the first impurity region, the second impurity region having the same conductivity type as the first impurity region;
    a first gate insulating layer forming step of forming a first gate insulating layer so as to surround an outer periphery of the first semiconductor pillar that lies between the first impurity region and the second impurity region;
    a first gate conductor layer forming step of forming a first gate conductor layer so as to surround an outer periphery of the first gate insulating layer;
    a wiring semiconductor layer forming step of forming a wiring semiconductor layer in electrical contact with an outer peripheral side surface of the second impurity region, the outer peripheral side surface of the second impurity region extending vertically with respect to the substrate, wherein in the wiring semiconductor layer forming step, the wiring semiconductor layer is formed with a longitudinally extending side that horizontally extends in a plane passing through the outer peripheral side surface of the second impurity region;

a first and second alloy layers forming step of forming a first alloy layer in a side surface of the wiring semiconductor layer and forming a second alloy layer in an upper surface and the side surface of the wiring semiconductor layer so that the second alloy layer is connected to the first alloy layer and separated from the second impurity region;

a contact hole forming step of forming a contact hole on an upper surface of the second alloy layer; and a wiring metal layer forming step of forming a wiring metal layer electrically connected to the second impurity region through the contact hole, wherein a first SGT is formed in which when one of the first impurity region and the second impurity region serves as a source, the other serves as a drain, the first semiconductor pillar that lies between the first impurity region and the second impurity region serves as a channel, and the first gate conductor layer surrounding the outer periphery of the first gate insulating layer serves as a gate.

2. The method for manufacturing an SGT-including semiconductor device according to claim 1, the method comprising:

a third impurity region forming step of forming a third impurity region in an upper portion of the first semiconductor pillar, the third impurity region being located above the second impurity region;

a fourth impurity region forming step of forming a fourth impurity region in the first semiconductor pillar at a position above and remote from the third impurity region, the fourth impurity region having the same conductivity type as the third impurity region;

a second gate insulating layer forming step of forming a second gate insulating layer so as to surround an outer periphery of the first semiconductor pillar that lies between the third impurity region and the fourth impurity region;

a second gate conductor layer forming step of forming a second gate conductor layer so as to surround an outer periphery of the second gate insulating layer;

the wiring semiconductor layer forming step of forming the wiring semiconductor layer in contact with the second impurity region and the third impurity region so that the wiring semiconductor layer connects the second impurity region to the third impurity region;

a fifth impurity region forming step of forming a fifth impurity region in the wiring semiconductor layer, the fifth impurity region being connected to the second impurity region, containing a donor or acceptor impurity contained in the second impurity region so as to have the same conductivity type as the second impurity region, and being in contact with the first alloy layer;

a sixth impurity region forming step of forming a sixth impurity region in the wiring semiconductor layer, the sixth impurity region being connected to the third impurity region, containing a donor or acceptor impurity contained in the third impurity region so as to have the same conductivity type as the third impurity region, and being in contact with the first alloy layer;

the second alloy layer forming step of forming the second alloy layer in the upper surface and the side surface of the wiring semiconductor layer, the second alloy layer being connected to the first alloy layer;

the contact hole forming step of forming the contact hole on the upper surface of the second alloy layer; and the wiring metal layer forming step of forming the wiring metal layer electrically connected to the second impurity region and the third impurity region through the contact hole, wherein a second SGT is formed in which when one of the third impurity region in contact with the second impurity region of the first SGT and the fourth impurity region serves as a source, the other serves as a drain, the first semiconductor pillar that lies between the third impurity region and the fourth impurity region serves as a channel, and the second gate conductor layer surrounding the outer periphery of the second gate insulating layer serves as a gate.

3. The method for manufacturing an SGT-including semiconductor device according to claim 2, wherein the wiring semiconductor layer is caused to contain a donor or acceptor impurity contained in the impurity region having the lower impurity concentration out of the second impurity region and the third impurity region;

the donor or acceptor impurity contained in the wiring semiconductor layer is thermally diffused into the first semiconductor pillar from the wiring semiconductor layer; and the second impurity region and the third impurity region are formed in the first semiconductor pillar.

4. The method for manufacturing an SGT-including semiconductor device according to claim 1, wherein the contact hole is formed on the upper surface of the second alloy layer so as to contain the upper surface and the side surface of the second alloy layer in a portion of the contact hole.

5. The method for manufacturing an SGT-including semiconductor device according to claim 4, wherein the wiring semiconductor layer is formed to have a thickness larger than a half of a length of one side of the contact hole in plan view.

6. The method for manufacturing an SGT-including semiconductor device according to claim 2, the method comprising forming the second alloy layer so as to contact the fifth impurity region and the sixth impurity region.

7. The method for manufacturing an SGT-including semiconductor device according to claim 2, the method comprising:

causing the wiring semiconductor layer to contain a donor or acceptor impurity;

forming a seventh impurity region in the first semiconductor pillar by thermally diffusing the donor or acceptor impurity of the wiring semiconductor layer into the first semiconductor pillar through a heat treatment; and forming SGTs of the same conductivity type above and below the seventh impurity region.

8. The method for manufacturing an SGT-including semiconductor device according to claim 1, wherein the wiring semiconductor layer forming step is performed such that the wiring semiconductor layer directly physically contacts the outer peripheral side surface of the second impurity region.

* * * * *